(12) United States Patent
Mamitsu et al.

(10) Patent No.: US 6,967,404 B2
(45) Date of Patent: *Nov. 22, 2005

(54) SEMICONDUCTOR DEVICE HAVING RADIATION STRUCTURE

(75) Inventors: Kuniaki Mamitsu, Nukata-gun (JP); Yasuyoshi Hirai, Gamagori (JP)

(73) Assignee: Denso Corporation, Kariya (JP)

( * ) Notice: Subject to any disclaimer, the term of this patent is extended or adjusted under 35 U.S.C. 154(b) by 23 days.

This patent is subject to a terminal disclaimer.

(21) Appl. No.: 10/699,954

(22) Filed: Nov. 4, 2003

(65) Prior Publication Data

US 2004/0097082 A1 May 20, 2004

Related U.S. Application Data

(63) Continuation of application No. 09/717,227, filed on Nov. 22, 2000, now Pat. No. 6,703,707.

(30) Foreign Application Priority Data

| Nov. 24, 1999 | (JP) | ............................................ 11-333119 |
| Nov. 24, 1999 | (JP) | ............................................ 11-333124 |
| Mar. 24, 2000 | (JP) | ........................................ 2000-88579 |
| Mar. 30, 2000 | (JP) | ........................................ 2000-97911 |
| Mar. 30, 2000 | (JP) | ........................................ 2000-97912 |
| Oct. 4, 2000 | (JP) | ........................................ 2000-305228 |

(51) Int. Cl.[7] .............................................. H01L 23/34
(52) U.S. Cl. ....................................... 257/718; 257/712
(58) Field of Search ................................... 257/712, 713, 257/718, 719, 720, 723, 722, 729

(56) References Cited

U.S. PATENT DOCUMENTS

| 4,141,030 A | 2/1979 | Eisele et al. |
| 4,470,063 A | 9/1984 | Arakawa et al. |
| 4,538,170 A | 8/1985 | Yerman |
| 4,546,374 A | 10/1985 | Olsen et al. |
| 4,558,345 A | 12/1985 | Dwyer et al. |
| 4,620,215 A | 10/1986 | Lee |
| 4,646,129 A | 2/1987 | Yerman et al. |
| 4,827,082 A | 5/1989 | Horiuchi et al. |
| 4,984,061 A | 1/1991 | Matsumoto |

(Continued)

FOREIGN PATENT DOCUMENTS

| EP | 0450980 | 4/1991 |
| EP | 0660396 | 12/1993 |
| GB | 2146174 | 11/1985 |
| JP | 54-40569 | 3/1979 |
| JP | 54-95183 | 7/1979 |
| JP | 59-031042 | 2/1984 |
| JP | 59-38734 | 9/1984 |
| JP | 60-95947 | 5/1985 |
| JP | 60-137042 | 7/1985 |

(Continued)

OTHER PUBLICATIONS

U.S. Appl. No. 10/201,556, filed Jul. 24, 2002, Hirano et al.
Takamura, "Electronic Technology", pp. 56–59 (May 1999).
Johnson et al., "Silicon Precipitate Nodule–Induced Failures of MOSFETS", ISTFA '91 (Nov. 11–15, 1991), pp. 161–165.
U.S. Appl. No. 09/675,209, filed Sep. 29, 2000, Suzuki.

*Primary Examiner*—Roy Potter
(74) *Attorney, Agent, or Firm*—Posz Law Group, PLC

(57) ABSTRACT

A semiconductor device includes two semiconductor chips that are interposed between a pair of radiation members, and thermally and electrically connected to the radiation members. One of the radiation members has two protruding portions and front ends of the protruding portions are connected to principal electrodes of the semiconductor chips. The radiation members are made of a metallic material containing Cu or Al as a main component. The semiconductor chips and the radiation members are sealed with resin with externally exposed radiation surfaces.

2 Claims, 26 Drawing Sheets

U.S. PATENT DOCUMENTS

| | | | |
|---|---|---|---|
| 5,221,851 A | 6/1993 | Gobrecht et al. |
| 5,229,646 A | 7/1993 | Tsumura |
| 5,248,853 A | 9/1993 | Ishikawa et al. |
| 5,293,301 A | 3/1994 | Tanaka et al. |
| 5,364,802 A | 11/1994 | Kataoka et al. |
| 5,396,403 A | 3/1995 | Patel |
| 5,481,137 A | 1/1996 | Harada et al. |
| 5,608,610 A | 3/1997 | Brzezinski |
| 5,641,997 A | 6/1997 | Ohta et al. |
| 5,663,097 A | 9/1997 | Sakamoto et al. |
| 5,708,299 A | 1/1998 | Teramae et al. |
| 5,723,882 A | 3/1998 | Okabe et al. |
| 5,726,466 A | 3/1998 | Nishitani |
| 5,789,820 A | 8/1998 | Yamashita |
| 5,801,445 A | 9/1998 | Ishihara et al. |
| 5,915,179 A | 6/1999 | Etou et al. |
| 5,977,570 A | 11/1999 | Takahashi et al. |
| 5,990,550 A | 11/1999 | Umezawa |
| 6,072,240 A | 6/2000 | Kimura et al. |
| 6,084,284 A | 7/2000 | Adamic, Jr. |
| 6,353,258 B1 | 3/2002 | Inoue et al. |
| 6,380,622 B1 | 4/2002 | Hirai |
| 6,426,877 B1 | 7/2002 | Baba |
| 6,448,645 B1 | 9/2002 | Kimura |
| 6,472,305 B1 | 10/2002 | Ozaki et al. |
| 6,538,308 B1 | 3/2003 | Nakase |
| 6,555,052 B2 | 4/2003 | Soga et al. |
| 2002/0109183 A1 | 8/2002 | Ishimura et al. |
| 2002/0158333 A1 | 10/2002 | Teshima |
| 2003/0042537 A1 | 3/2003 | Nakamura et al. |
| 2003/0047778 A1 | 3/2003 | Nakamura et al. |
| 2003/0166812 A1 | 9/2003 | Taniguchi et al. |
| 2003/0186072 A1 | 10/2003 | Soga et al. |

FOREIGN PATENT DOCUMENTS

| | | |
|---|---|---|
| JP | 60-235430 | 11/1985 |
| JP | A-61-147539 | 7/1986 |
| JP | 61-166051 | 7/1986 |
| JP | 61-251043 | 11/1986 |
| JP | 61-265849 | 11/1986 |
| JP | 62-92349 | 4/1987 |
| JP | 62-141751 | 6/1987 |
| JP | 62-287649 | 12/1987 |
| JP | 63-096946 | 4/1988 |
| JP | 63-102326 | 5/1988 |
| JP | 01-228138 | 9/1989 |
| JP | 2-117157 | 5/1990 |
| JP | 3-20067 | 1/1991 |
| JP | 4-12555 | 1/1992 |
| JP | 4-27145 | 1/1992 |
| JP | 4-103150 | 4/1992 |
| JP | 4-249353 | 9/1992 |
| JP | 5-109919 | 4/1993 |
| JP | A-5-283562 | 10/1993 |
| JP | 6-291223 | 10/1994 |
| JP | A-6-349987 | 12/1994 |
| JP | A-7-45765 | 2/1995 |
| JP | 07-038013 | 2/1995 |
| JP | A-H07-66143 | 3/1995 |
| JP | 07-240432 | 9/1995 |
| JP | 07-273276 | 10/1995 |
| JP | 8-45874 | 2/1996 |
| JP | 08-191145 | 7/1996 |
| JP | A-H09-45773 | 2/1997 |
| JP | 9-148492 | 6/1997 |
| JP | A-H09-237868 | 9/1997 |
| JP | 10-65072 | 3/1998 |
| JP | A-10-125700 | 5/1998 |
| JP | A-11-186469 | 7/1999 |
| JP | A-H11-204803 | 7/1999 |
| JP | 11-260979 | 9/1999 |
| JP | 11-284103 | 10/1999 |
| JP | A-2000-31351 | 1/2000 |
| JP | 2000-31355 | 1/2000 |
| JP | 2000-91485 | 3/2000 |
| JP | A-2001-118961 | 4/2001 |
| WO | WO98/12748 | 3/1998 |

FIG. 3

CHEMICAL COMPOSITION (%)

| NAME OF METAL | Fe | Zn | P | Ni | Si | Sn | NiB | Mn | Mg | Cr | Ti | B | Cu | Al |
|---|---|---|---|---|---|---|---|---|---|---|---|---|---|---|
| METAL a | 2.3 | 0.1 | 0.03 | | | | | | | | | | REMAIN. | |
| METAL b | 2.4 | 0.12 | 0.03 | | | | | | | | | | REMAIN. | |
| METAL c | | | | 3.0 | 0.7 | | | | | | | | REMAIN. | |
| METAL d | 1.5 | 0.5 | | | | 0.5 | | | | | | | REMAIN. | |
| METAL e | 1.0 | 0.05 | 0.1 | | | 1.0 | | | | | | | REMAIN. | |
| METAL f | 0.75 | | 0.03 | | | 1.25 | | | | | | | REMAIN. | |
| METAL g | 0.05~0.15 | | 0.025~0.040 | 0.1~0.4 | | 0.05~0.2 | 0.05~0.45 | | | | | | REMAIN. | |
| METAL h | 0.05~0.4 | | 0.05~0.1 | 3.0~3.4 | 0.6~0.75 | 1.7~2.3 | | | | | | | REMAIN. | |
| METAL i | | | 0.15 OR LOWER | | 0.1~1.0 | 1.0~1.5 | | | | | | | REMAIN. | |
| METAL j | | 0.2~0.35 | | | 0.6~0.75 | | | | | | | | REMAIN. | |
| METAL k | 0.12~1.0 | 0.03~0.1 | | | | | | 0.02~0.05 | 0.02~0.05 | | 0.02~0.05 | | 0.03~0.2 | REMAIN. |
| METAL l | 0.5 | 0.1 | | | | | | 0.05 | 0.35~0.5 | 0.03 | | 0.06 | 0.1 | REMAIN. |

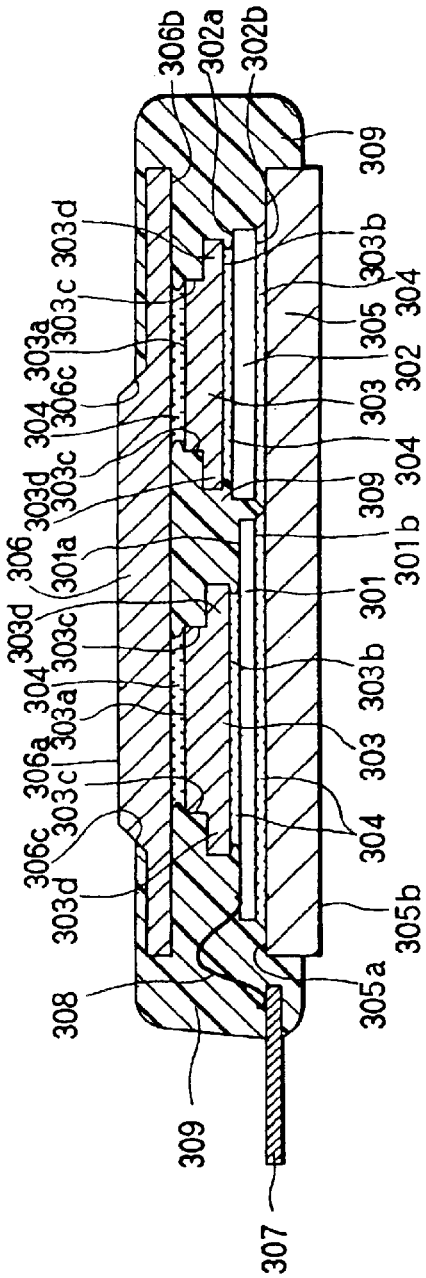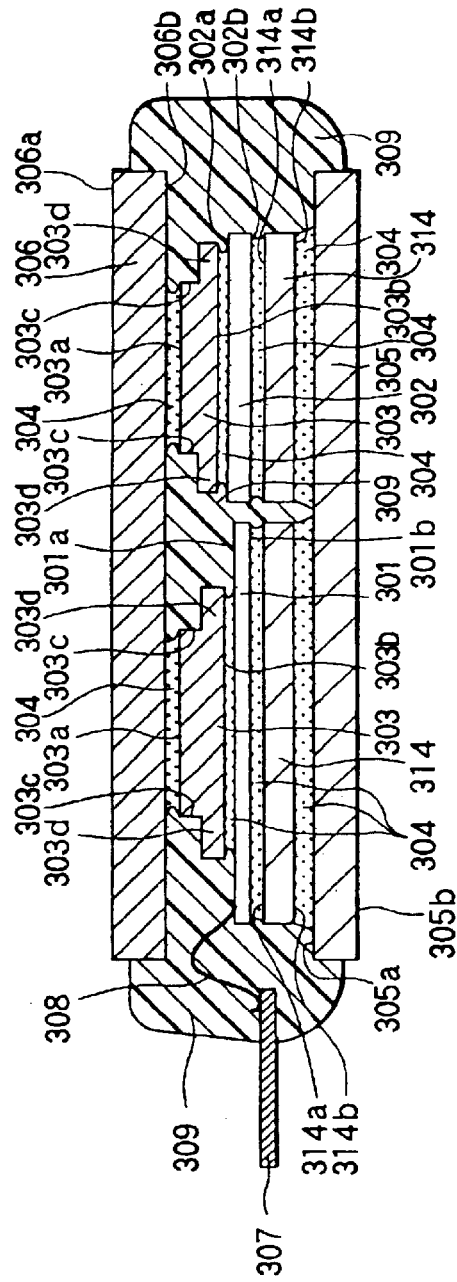

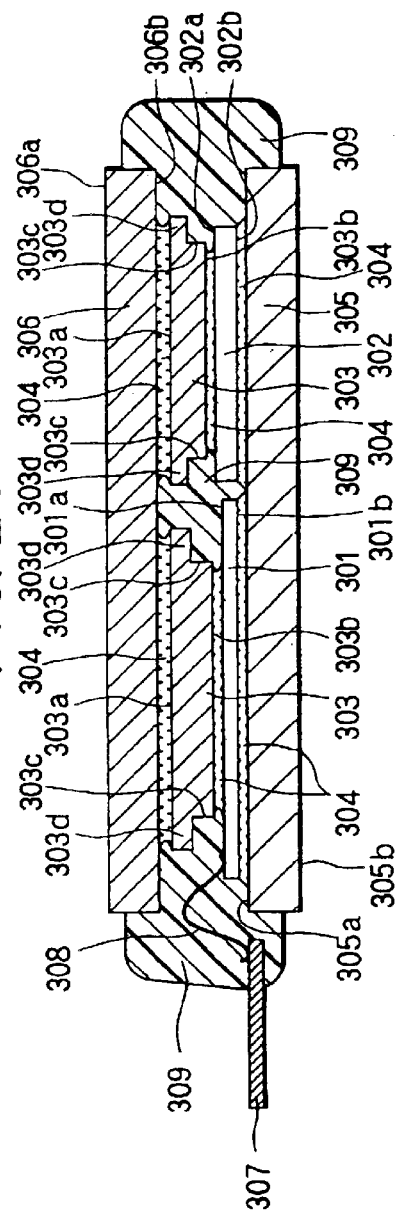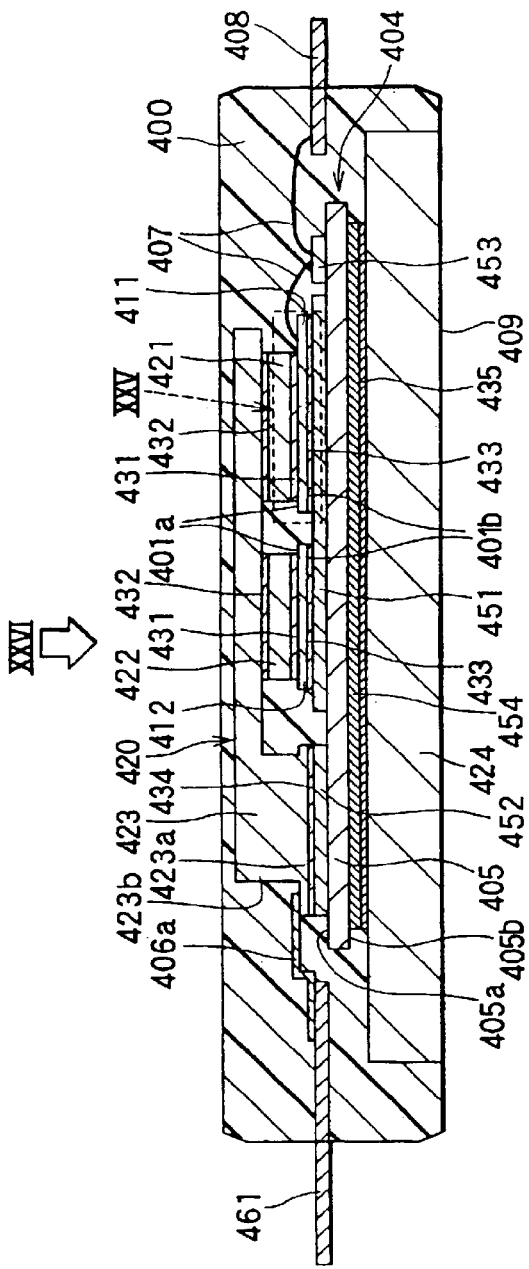

FIG. 31
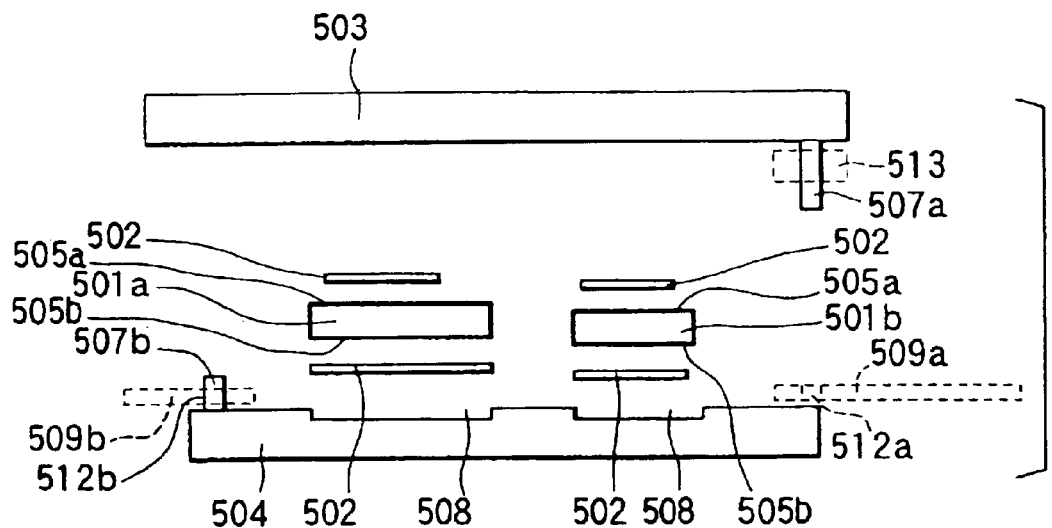
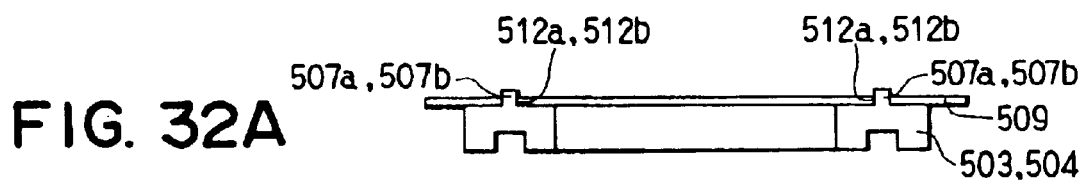
FIG. 32A
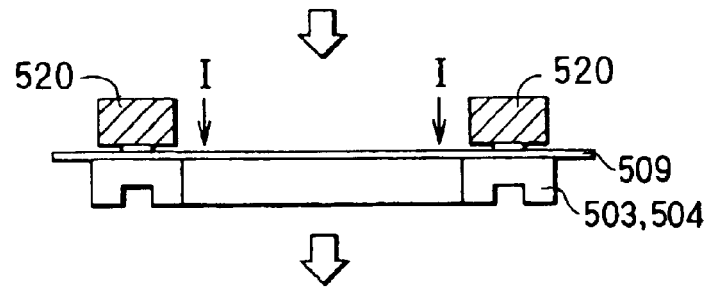
FIG. 32B
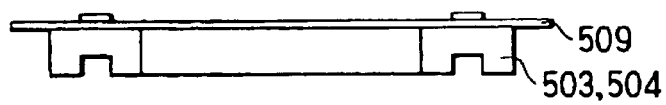
FIG. 32C

SEMICONDUCTOR DEVICE HAVING RADIATION STRUCTURE

CROSS REFERENCE TO RELATED APPLICATIONS

This application is a continuation application of application Ser. No. 09/717,227, which was filed on Nov. 22, 2000 now U.S. Pat. No. 6,703,707, and which was based upon and claimed the benefit of Japanese Patent Applications No. 11-333119 filed on Nov. 24, 1999, No. 11-333124 filed on Nov. 24, 1999, No. 2000-88579 filed on Mar. 24, 2000, No. 2000-97911 filed on Mar. 30, 2000, No. 2000-97912 filed on Mar. 30, 2000 and No. 2000-305228 filed on Oct. 4, 2000, the contents of which are incorporated herein by reference.

BACKGROUND OF THE INVENTION

1. Field of the Invention

This invention relates to a semiconductor device in which heat is radiated from both sides of a semiconductor chip accommodated therein.

2. Description of the Related Art

For example, JP-A-6-291223 discloses a semiconductor device in which heat is radiated from both sides of a semiconductor chip. FIGS. 1A to 1C show this semiconductor device. As shown in the figures, a pair of radiation members J2, J3 sandwich several semiconductor chips J1, and are thermally and electrically connected to the semiconductor chips J1. The several semiconductor chips J1 arranged on a plane and the radiation members J2, J3 are sealed with resin J5.

Each of the radiation members J2, J3 serves as an electrode, and has a surface exposed from the resin J5 at an opposite side of the face contacting the semiconductor chips J1. Each of the radiation members J2, J3 performs radiation of heat by making the exposed surface contact a contact body (not shown) that can exhibit a radiation action. A control terminal J4 connected with a control electrode of the semiconductor chips J1 protrudes to an outside from the resin J5.

Used as the radiation members J2, J3 is W (tungsten) or Mo (molybdenum) having a thermal expansion coefficient approximate to that of the semiconductor chips J1. The radiation member J2 that is connected to the surfaces of the semiconductor chips J1 on which the control electrode is formed is an emitter electrode, and the radiation member J3 that is connected to the surfaces of the semiconductor chips J1 at an opposite side of the control electrode is a collector electrode.

Besides, several solder bumps J7 protrudes from an insulating plate J6 that has a through hole at a center thereof in which the radiation member J2 penetrates as the emitter electrode. The solder bumps J7 are bonded to bonding pads existing in unit patterns of the respective semiconductor chips J1 disposed on the radiation member J3 as the collector electrode.

When the radiation members J2, J3 serving also as electrodes are made of metallic material such as W or Mo having linear thermal expansion coefficient approximate to that of the semiconductor chips J1 made of Si (silicon), these metallic materials are, in electrical conductivity about one third of that of Cu (copper) or Al (aluminum), and in thermal conductivity about one third to two third thereof. Thus, in the present circumstances involving an increased requirement for flowing a large current in the semiconductor chip, using W or Mo as a member that serves as a radiation member and an electrode simultaneously causes many problems.

Also, in general, a larger chip is required to accommodate a larger current. However, there are many technological problems to increase the chip size, and it is easier to manufacture plural smaller chips and accommodate them into one package.

In the technique disclosed in the publication describe above, the several semiconductor chips J1 are formed in the semiconductor device. However, as shown in FIG. 1A, because the radiation member J2 has a simple rectangular shape, and is provided at the center of the device, disposal of different semiconductor chips in one device is limited. That is, when the semiconductor chips are different from one another in, for example, thickness, it is difficult for the one emitter electrode having a simple shape to be connected to all of the different semiconductor chips.

SUMMARY OF THE INVENTION

The present invention has been made in view of the above problem. An object of the present invention is to improve a radiation property and an electrical conductivity of a semiconductor device including radiation members that are thermally and electrically connected to both surfaces of a semiconductor chip therein. Another object of the present invention is to provide a semiconductor device easily accommodating several different semiconductor chips therein.

For example, according to one aspect of the present invention, in a semiconductor device in which a semiconductor chip is thermally and electrically connected to first and second radiation members therebetween, the first and second radiation members are made of a metallic material that is superior to tungsten and molybdenum in at least one of an electrical conductivity and a thermal conductivity. Accordingly, the radiation property and the electrical conductivity of the semiconductor device can be improved.

According to another aspect of the present invention, in a semiconductor device in which first and second semiconductor chips are thermally and electrically connected to first and second radiation members therebetween, the first radiation member has first and second protruding portions protruding toward the first and second semiconductor chips, and first and second front end portions of the first and second protruding portions are thermally and electrically connected to the first and second semiconductor chips through a bonding member.

In this case, even when the first and second semiconductor chips are different from each other in thickness, the first and second radiation members can be provided with first and second radiation surfaces approximately parallel to each other by controlling protruding amounts of the first and second protruding portions.

According to still another aspect of the present invention, in a semiconductor device in which a semiconductor chip is disposed between a first conductive member and a second conductive member, the first conductive member is further bonded to a third conductive member at an opposite side of the semiconductor chip so that a bonding area between the first conductive member and the third conductive member is smaller than that between the first conductive member and the semiconductor chip. Accordingly, stress concentration on the first conductive member can be suppressed to prevent occurrence of cracks. This results in improved radiation property and electrical conductivity of the semiconductor device.

BRIEF DESCRIPTION OF THE DRAWINGS

Other objects and features of the present invention will become more readily apparent from a better understanding of the preferred embodiments described below with reference to the following drawings, in which;

FIG. 3 is a table showing metals usable for a radiation member in the first embodiment;

FIG. 21 is a cross-sectional view showing a semiconductor device in a fourteenth preferred embodiment;

FIG. 22 is a cross-sectional view showing a semiconductor device in a fifteenth preferred embodiment;

FIG. 23 is a cross-sectional view showing a semiconductor device as a modification of the thirteenth embodiment;

FIG. 24 is a cross-sectional view showing a semiconductor device in a sixteenth preferred embodiment;

FIG. 31 is a schematic view showing a constitution observed in a side direction in a manufacturing process of the semiconductor device;

FIGS. 32A to 32C are schematic views showing a step for caulking fixation;

DETAILED DESCRIPTION OF THE PREFERRED EMBODIMENTS (First Embodiment)

Figure 1A:
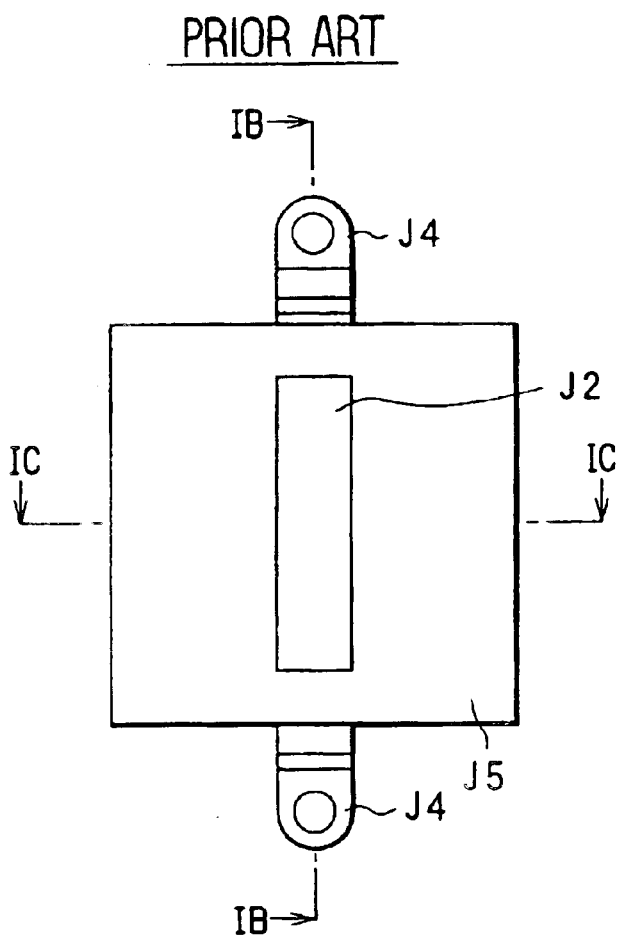
FIG. 1A is a schematic view showing a semiconductor device according to a prior art.
Figure 1B:
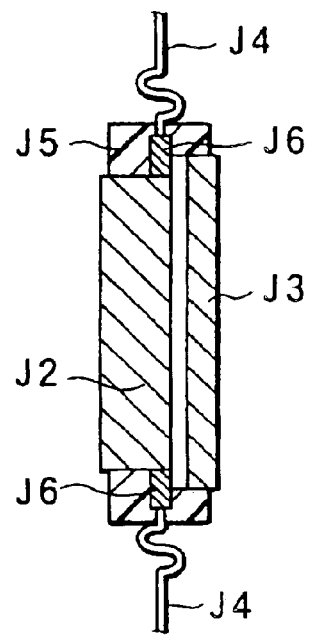
FIG. 1B is a cross-sectional view showing the semiconductor device, taken along line IB—IB in FIG. 1A.
Figure 1C:
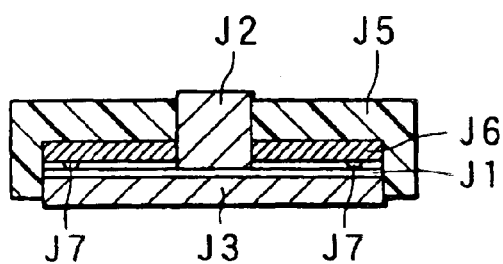
FIG. 1C is a cross-sectional view showing the semiconductor device, taken along line IC—IC in FIG. 1A.
Figure 2A:
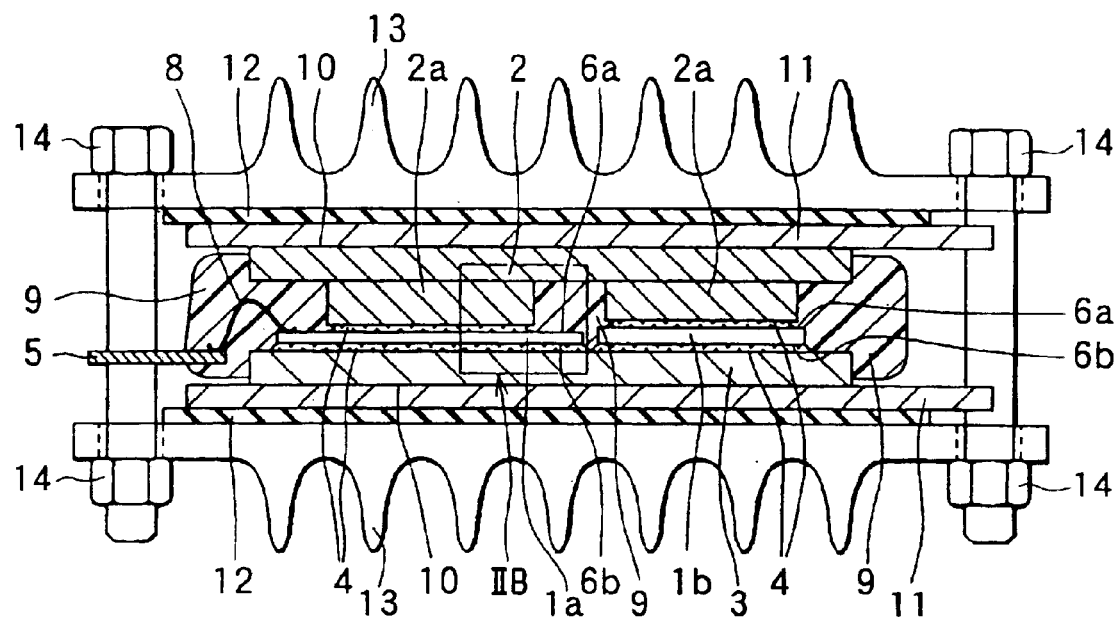
FIG. 2A is a cross-sectional view showing a semiconductor device in a first preferred embodiment.

A first preferred embodiment is described with reference to FIGS. 2A and 2B. As shown in FIG. 2A, a pair of radiation members 2, 3 are disposed to sandwich two Si chips 1a, 1b that are disposed on a plane. The radiation members 2, 3 are thermally and electrically connected to principal electrodes of the Si chips 1a, 1b through bonding members 4. Hereinafter, connection means thermal and electrical connection except cases in which specific descriptions are presented. A control electrode of the Si chip 1a is electrically connected to a control terminal 5, which is connected to a lead frame, via a wire 8 formed by wire bonding.

Specifically, the radiation member (first side radiation member) 2, facing upper surfaces (first surfaces) 6a of the Si chips 1a, 1b to which the wire bonding is performed is formed with protruding portions 2a protruding at a step-like shape at positions facing the principal electrodes of the Si chips 1a, 1b. Front ends of the protruding portions 2a are generally flat and the flat portions are respectively connected to the principal electrodes through the bonding members 4. Being generally flat means flat at a level that does not interfere with bonding between the protruding portions 2a and the principal electrodes.

Next, the protruding portions 2a are explained in more detail. As shown in FIG. 2B, when the Si chips 1a, 2b are power devices, each withstand voltage at peripheral portions of the Si chips 1a, 1b is kept by guard rings 7 that is provided on one surface of each chip, i.e., on the surface 6a or a surface (second surface) 6b opposed to the surface 6a.

Like the present embodiment, when metallic materials as the radiation members 2, 3 are bonded to the both surfaces of each Si chip 1a, 1b, the radiation member 2 is bonded to the surface (the first surfaces in this embodiment) 6a where the guard rings 7 are provided. However, referring to FIG. 2B, a distance indicated by an arrow B at the peripheral portions of the Si chips 1a, 1b, i.e., at the regions one of which is indicated by a broken line in the figure, the first side radiation member 2 must be electrically insulated from the guard rings 7 and from the edge surfaces of the Si chips 1a, 1b. Therefore, insulated regions must be provided there.

Because of this, the radiation member 2 has the protruding portions 2a at the positions facing the principal electrodes of the Si chips 1a, 1b. In other words, the radiation member 2 has recess portions at the positions facing the guard rings 7 of the Si chips 1a, 1b to avoid the high withstand regions (insulated regions).

The radiation member (second side radiation member) 3 bonded to the other surfaces 6b of the Si chips 1a, 1b has no protruding portion, and is generally flat. That is, the second side radiation member 3 is generally so flat that it does not interfere with mountability of the Si chips 1a, 1b to the radiation member 3. In the respective radiation members 2, 3, respective surfaces opposite to the surfaces facing the Si chips 1a, 1b constitute radiation surfaces 10 that are also generally flat and are approximately parallel to each other.

Here, in this embodiment, the wire-bonded Si chip is an IGBT (Insulated Gate Bipolar Transistor) 1a, while the other Si chip is a FWD (free-wheel diode) 1b. In the IGBT 1a, the first side radiation member 2 is an emitter, the second side radiation member 3 is a collector, and the control electrode is a gate. As shown in FIG. 2A, the thickness of the FWD 1b is larger than that of the IGBT 1a. Therefore, in the first side radiation member 2, the protruding portion 2a facing the IGBT 1a has a protruding amount relatively larger than that of the other protruding portion 2a facing the FWD 1b.

As the first side and second side radiation members 2, 3, for example, a metallic material including Cu or Al as a main component can be used, which has electrical conductivity and thermal conductivity larger than those of W and Mo, and is cheaper that those. FIG. 3 is a table showing examples of metallic materials usable as the radiation members 2, 3. As shown in FIG. 3, the radiation members 2, 3 can be made of one of metal "a" to metal "1", anoxia copper, and the like. Here, for example, metal "a" is an alloy containing, in mass ratio, Fe (iron) at 2.3%, An (zinc) at 0.1%, P (phosphorous) at 0.03%, and Cu as the remainder.

The bonding members 4 are preferable to have a shear strength superior to a shear stress produced by thermal stress, and to be superior in both thermal conductivity and electrical conductivity. As such conductive members 4, for example, solder, brazing filler metal, or conductive adhesive can be used. The wire 8 for wire bonding can be made of Au (gold), Al, or the like which is used for wire bonding in general.

Also, as shown in FIG. 2A, these members 1 to 5, and 8 are sealed with resin 9 while exposing the radiation surfaces 10 of the radiation members 2, 3 at the opposite side of the Si chips 1a, 1b, and exposing simultaneously the control terminal 5 at the opposite side of the wire bonding. The radiation surfaces 10 of the respective radiation members 2, 3 serve as electrodes and perform radiation of heat simultaneously. The resin 9 preferably has a thermal expansion coefficient approximate to those of the radiation members 2, 3. For example, epoxy based mold resin can be used as such resin 9.

Further, the resin-sealed members 1 to 5 and 8 are sandwiched by a pair of outside wiring members 11 so that the radiation surfaces 10 contact the outside wiring members 11. Each of the outside wiring members 11 is a flat plate having a portion with a plate shape or a fine wire shape that is conducted to be interconnected with an outside. The outside wiring members 11 and the resin-sealed members 1 to 5, and 8 are further sandwiched by a pair of outside cooling members 13 with plate-shaped high thermal conductivity insulating substrates 12 interposed therebetween. The resin-sealed members 1 to 5 and 8, the outside wiring members 11, the high thermal conductivity insulating substrates 12, and the outside cooling members 13 are fixed by volts 4 or the like screwed from the outside cooling members 13.

The outside wiring members 11 may be made of any materials provided that they are superior in thermal conductivity and electrical conductivity. The high thermal conductivity insulating substrates 12 can be made of, for example, one of AlN (aluminum nitride), SiN (silicon nitride), $Al_2O_3$ (aluminum dioxide), SiC (silicon carbide), BN (boron nitride), diamond or the like. The outside cooling members 13 is constructed to include a radiation fin, or to be cooled by water.

According to the constitution described above, as to an electrical path, current flow in the order of the outside wiring member 11 contacting the first side radiation member 2, the first side radiation member 2, the Si chips 1a, 1b, the second side radiation member 3, the outside wiring member 11 contacting the second side radiation member 3 or in the inverse order. As to a thermal path, heat produced in the Si chips 1a, 1b is transferred to the first side and second side radiation members 2, 3, the outside wiring members 11, the high thermal conductivity insulating substrates 12, and the outside cooling members 13, and then is radiated.

Figure 2B:
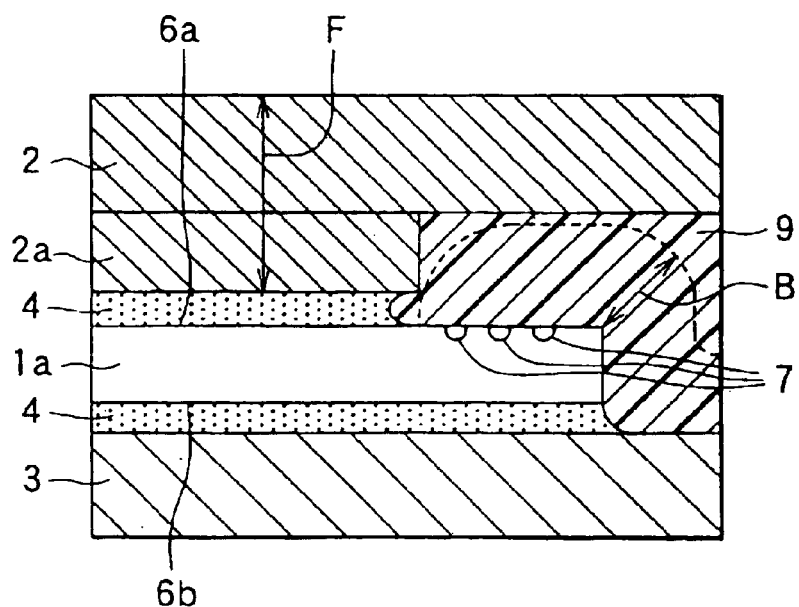
FIG. 2B is an enlarged cross-sectional view showing a part indicated by arrow IIB in FIG. 2A.

Next, a method for manufacturing the semiconductor device shown in FIGS. 2A and 2B is explained. First, the principal electrodes on the second surfaces 6b of the Si chips 1a, 1b are bonded to the second side radiation member 3 through the bonding members 4. Next, the control electrode of the Si chip 1a and the control terminal 5 are electrically connected to each other by wire bonding. After that, the principal electrodes on the first surfaces 6a of the Si chips 1a, 1b are bonded to the front ends of the protruding portions 2a of the first side radiation member 2 by bonding members 4. Here, the protruding portions 2a of the first side radiation member 2 are formed by pressing or the like previously.

Subsequently, a die (not show) is prepared, and the integrated Si chips 1a, 1b and the first side and second side radiation members 2, 3 are disposed in the die and is sealed with resin. Accordingly, electrical insulation between the radiation members 2, 3 can be attained. Successively, as described above, with respect to the radiation surfaces 10, the outside wiring members 11, the high thermal conductivity insulating substrates 12, and the outside cooling members 13 are disposed in this order. Then, the outside cooling members 13 are fastened with volts, so that the members 11 to 13 are fixed. In consequence, the semiconductor device in the present embodiment is completed.

According to the present embodiment, because the first side and second side radiation members 2, 3 are made of metallic material containing Cu or Al as a main component that is superior in thermal conductivity and electrical conductivity, the semiconductor device can be provided with improved radiation property and improved electrical conductivity. Further, because these members can be manufactured at lower cost as compared to a conventional case using W or Mo, the semiconductor device can be provided at low cost. Furthermore, the metallic material containing Cu or Al as the main component is so soft as compared to W or Mo that workability for forming the protruding portions 2a on the first side radiation member 2 is good.

Besides, because the protruding portions 2a are provided on the first side radiation member 2 and are connected to the respective different Si chips 1a, 1b, the connection between the respective Si chips 1a, 1b and the radiation member 2 can be performed appropriately. Specifically, the protruding amounts and the shapes of the protruding portions 2 can be changed in accordance with the thicknesses of the Si chips 1a, 1b and the shapes of the principal electrodes of the Si chips 1a, 1b. Because of this, the different semiconductor chips 1a, 1b can be easily accommodated in the semiconductor device.

The radiation surfaces 10 of the radiation members 2, 3 may have irregularities thereon or may not be parallel to each other. However, in this embodiment, the radiation surfaces 10 are made flat and approximately parallel to each other. This is made possible because the surface step, i.e., the difference in thickness between the Si chips 1a, 1b can be absorbed by the protruding portions 2a by controlling the protruding amounts thereof in accordance with the respective thicknesses of the Si chips 1a, 1b.

As a result, in the present embodiment, because the radiation surfaces 10 are generally flat and approximately parallel to each other, when the volts are fastened to the radiation surfaces 10 with the outside wiring members 11, the high thermal conductivity insulating substrates 12, and the outside cooling members 13 interposed therebetween, the surfaces 10 and these members 11 to 13 can be brought in contact with each other securely and easily at the interfaces thereof.

Moreover, because the radiation surfaces 10 are approximately parallel to each other, a force produced by fastening the volts is uniformly applied to the members 1 to 5, 8, 9, and 11 to 13. Therefore, these members 1 to 5, 8, 9, and 11 to 13 are not damaged or destroyed by deviation of the force, and the assembling performance can be improved.

In general, though the IGBT 1a and the FWD 1b are used as a pair, as the distance between the IGBT 1a and the FWD 1b is decreased, an operation on a circuit becomes more ideal. According to the present embodiment, because the IGBT 1a and the FWD 1b are disposed adjacently to each other in the integrally resin-sealed semiconductor device, the operation of the IGBT 1a can approach the ideal state in the semiconductor device.

When the object of the invention is limited to provide a semiconductor device capable of accommodating the different semiconductor chips 1a, 1b easily, the materials for forming the first side and second side radiation members 2, 3 are not limited to the materials containing Cu or Al as a main component but may be other conductive materials having electrical conductivity. That is, when the prevention of breakage of the bonding members 4 caused by thermal stress is of greater importance, the first side and second side radiation members 2, 3 should be made of metallic material having a thermal expansion coefficient approximate to that of the Si chips 1a, 1b. On the other hand, when the radiation property and the electrical conductivity are of greater importance, the radiation members 2, 3 should be made of metallic material containing Cu or Al as a main component.

The resin 9 used in the present embodiment not only insulates the radiation members 2, 3 from each other but also reinforces the bonding between the radiation members 2, 3 and the Si chips 1a, 1b by connecting the radiation members 2, 3 to the Si chips 1a, 1b. Therefore, even when the radiation members 2, 3 are made of a metallic material containing Cu or Al as a main component, which has a thermal expansion coefficient different from that of the Si chips 1a, 1b, the breakage of the bonding members 4 caused by thermal stress can be relaxed by the resin 9.

Especially when the resin 9 has a thermal expansion coefficient approximate to that of the radiation members 2, 3, stress is applied to the Si chips 1a, 1b to promote expansion and contraction similar to those of the radiation members 2, 3 when temperature varies. Therefore, stress applied to the bonding members 4 is relaxed and generation of strain is restricted, resulting in improvement of reliability at the connection portions.

Incidentally, although the second side radiation member 3 has no protruding portion thereon in the present embodiment, it may have a protruding portion. Thermal conductive grease or the like may be applied to the contact faces between the outside wiring members 11 and the high thermal conductivity insulating substrates 12, and between the high thermal conductivity insulating substrates 12 and the outside cooling members 13 to enhance thermal bonding further.

The contact between each outside wiring member 11 and each high thermal conductivity insulating substrate 12 is preferable to be fixed by pinching as in the present embodiment in consideration of the difference in thermal expansion coefficient between the members 11 and 12. However, each radiation surface 10 and each outside wiring member 11 can be connected by solder, brazing filler metal or the like because these members can be made of materials having thermal expansion coefficient not largely different from each other.

The body of the first side radiation member 2 may be separated from the protruding portions 2a. For example, the protruding portions 2a may be bonded to a plate-shaped body of the member 2 by soldering, welding, or the like. The material forming the first side radiation member 2 is not always necessary to be identical with that forming the second side radiation member 3. In the present embodiment, although the resin-sealing is performed by a die, the sealing may be performed by potting without any die.

Although it is described that the resin 9 for sealing has a thermal expansion coefficient approximate to those of the first side and second side radiation members 2, 3, the resin 9 is not limited to that, but may be other appropriate resin when there is no need to consider bonding strength between the Si chips 1a, 1b and the radiation members 2, 3.

Although it is described in the present embodiment that the IGBT 1a and the FWD 1b are used as the Si chips, in some cases such as that only one Si chip is used, or the same kind of Si chips are used, the connecting structure between the Si chip(s) and the radiation members 2, 3 is not complicated. In these cases, the protruding portions 2a need not be formed on one of the radiation members 2, 3. As described above, the semiconductor device having improved radiation property and electrical conductivity can be provided by forming the radiation members 2, 3 from a metallic material containing Cu or Al as a main component having electrical conductivity and thermal conductivity higher than those of W or Mo.

(Second Embodiment)

Figure 4A:
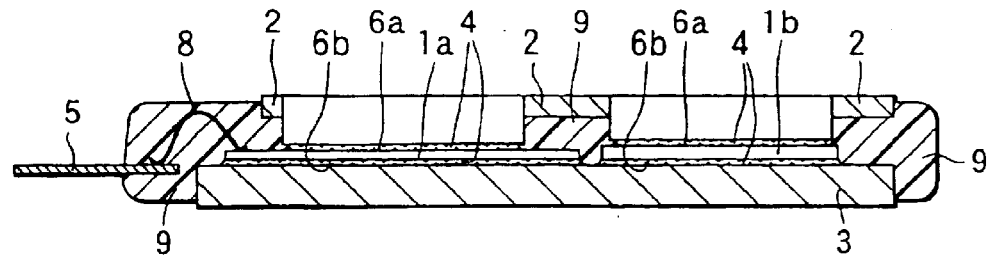
FIG. 4A is a cross-sectional view partially showing a semiconductor device in a second preferred embodiment.
Figure 4B:
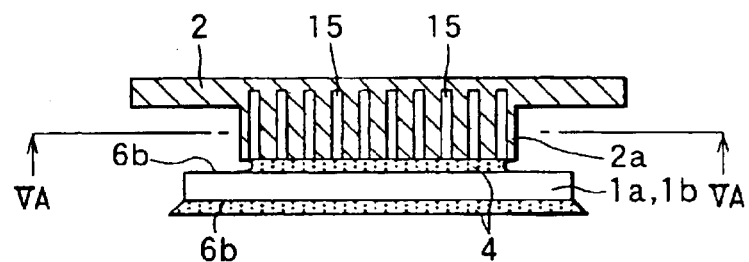
FIGS. 4B to 4D are cross-sectional views respectively showing a first side radiation member and a Si chip in the second embodiment.
Figure 4C:
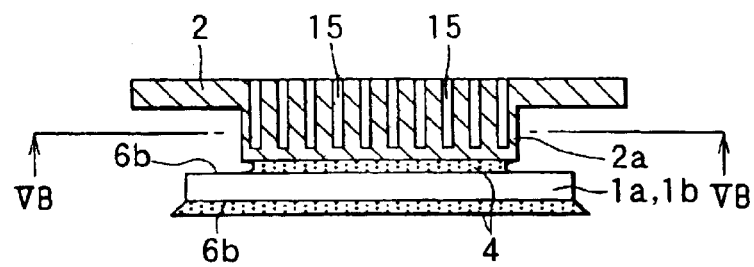
Figure 4D:
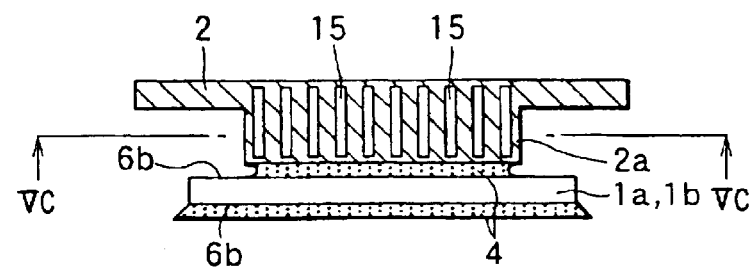
Figure 5A:
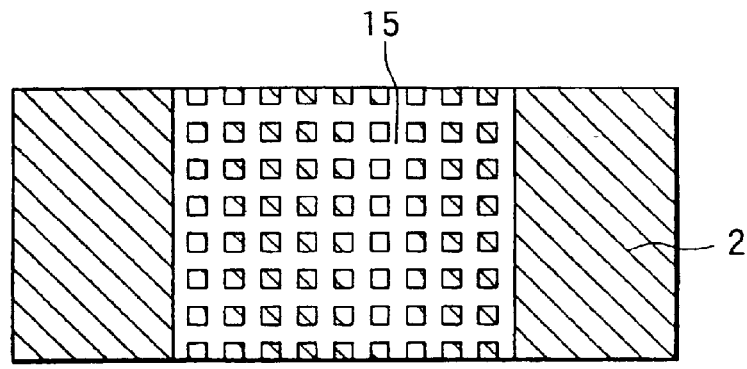
FIGS. 5A to 5C are cross-sectional views respectively taken along lines VA—VA, VB—VB, and VC—VC in FIGS. 4B to 4D.
Figure 5B:
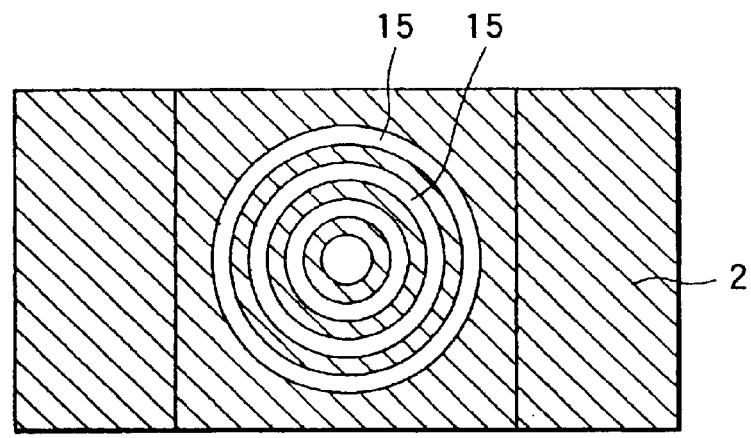
Figure 5C:
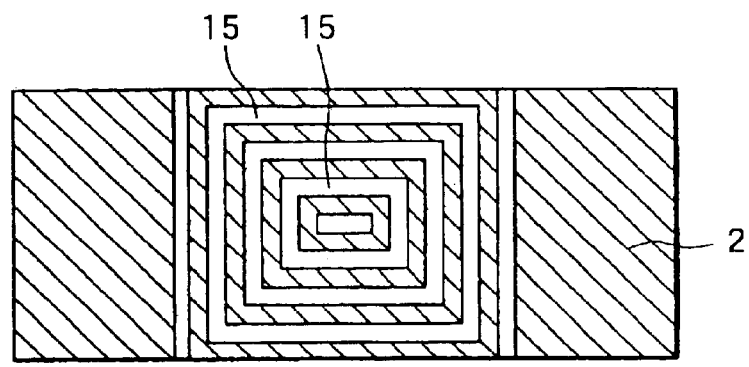

A second preferred embodiment differs from the first embodiment in an inside shape of the first side radiation member 2. FIG. 4A shows a semiconductor device in the second embodiment, and FIGS. 4B to 4D are cross-sectional views partially showing various first side radiation members 2 and Si chips 1a, 1b facing the respective radiation members 2. FIGS. 5A to 5C are cross-sectional views respectively taken along lines VA—VA, VB—VB, VC—VC in FIGS. 4B to 4D.

In FIG. 4A, the first side radiation member 2 is partially omitted, and the cross-sectional shapes shown in FIGS. 4B to 4D are applicable to the omitted part. FIG. 4A also omits the outside wiring members 11, the high thermal conductivity insulating substrates 12, and the outside cooling members 13. Hereinafter, different portions from those in FIG. 2A are explained. In FIGS. 4A to 4D and 5A to 5C, the same parts as those in FIG. 2A are indicated with the same reference numerals, and those explanation is made simple.

As shown in FIGS. 4A to 4D and 5A to 5C, the first side radiation member 2 has a space 15 at a portion connected to the Si chips 1a, 1b. The space 15 can have a lattice shape as in an example shown in FIG. 5A, be composed of several concentric circles as in an example shown in FIG. 5B, and be composed of several concentric rectangles as in an example shown in FIG. 5C. The shape of the space 15 in a direction perpendicular to the connection surface between the radiation member 2 and the Si chips 1a, 1b is as shown in FIGS. 4B, 4C, or 4D. That is, there are cases where the space 15 is open at the connecting portions with the Si chips 1a, 1b, is open at the radiation surface 10, and is closed both at the connecting portions with the Si chips 1a, 1b and the radiation surface 10.

The space 15 can be formed by, for example, cutting work. When the space 15 is closed both at the connecting portions with the Si chips 1a, 1b and the radiation surface 10 as shown in FIG. 4D, it can be formed by forming the radiation member with the space opened at the connecting portions with the Si chips 1a, 1b by cutting first as shown in FIG. 4B, and then by bonding a metal plate to close the opening portions by welding or the like.

According to the present embodiment, the same effects as those described in the first embodiment can be attained. In addition, the space 15 formed in the first side radiation member 2 increases the rigidity of the radiation member 2. As a result, stress applied to the Si chips 1a, 1b and to the bonding members 4 can be reduced, so that the breakage of the Si chips 1a, 1b can be prevented and the reliability in the bonding between the Si chips 1a, 1b and the radiation member 2 can be enhanced.

The other features not described in the second embodiment are substantially the same as those in the first embodiment. The space 15 is exemplified in cases it extends in the thickness direction of the Si chips 1a, 1b; however, it may extend in a surface direction of the chips 1a, 1b. Further, the space 15 may be formed in the second side radiation member 3. The space 15 needs not be formed uniformly at the portions contacting the Si chips 1a, 1b, and can be arranged appropriately at required positions.

The shape of the space 15 is not limited to the examples shown in the figures, provided that it can reduce the rigidity of the radiation member. When the radiation members 2, 3 are made of a metallic material including Cu or Al, it is easy to form the space 15 because the radiation members 2, 3 are easy to be processed.

(Third Embodiment)

Figure 6:
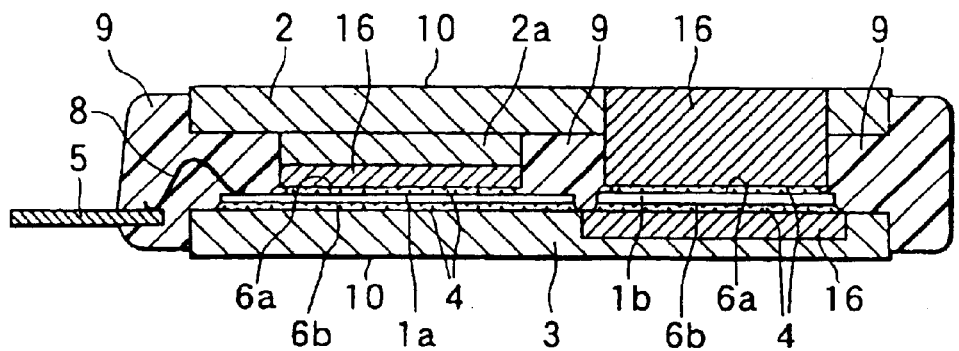
FIG. 6 is a cross-sectional view showing a semiconductor device in a third preferred embodiment.

FIG. 6 shows a semiconductor device in a third preferred embodiment, in which the outside wiring members 11, the high thermal conductivity insulating substrates 12, and the outside cooling members 13 shown in FIG. 2A are omitted. Hereinafter, different portions from those in the first embodiment are mainly explained, and in FIG. 6, the same parts as those in FIG. 2A are indicated with the same reference numerals.

As shown in FIG. 6, in the third embodiment, metallic members (partially disposed metallic members) 16 made of Mo, W, Cu—Mo, or the like having a thermal expansion coefficient approximate to that of Si chips are disposed at the portions of the first side and second side radiation members 2, 3 facing the Si chips 1a, 1b. The partially disposed metallic members 16 can be previously formed on the radiation members 2, 3 by soldering, brazing, shrinkage fitting, or press-fitting. To position the partially disposed metallic members 16 with respect to the Si chips 1a, 1b with high accuracy, the Si chips 1a, 1b and the partially disposed metallic members 16 should be bonded by soldering, brazing, or the like, previous to the bonding between the partially disposed metallic members 16 and the radiation members 2, 3 by soldering, brazing, or the like.

According to the present embodiment, the same effects as those in the first embodiment can be attained. In addition, because the thermal expansion coefficient at the connecting portions between the Si chips 1a, 1b and the first side and second side radiation members 2, 3 are approximated to each other, thermal stress produced by a change in temperature can be reduced at the connecting portions and the bonding strength can be enhanced. Also, the addition of the metallic members 16 having the thermal expansion coefficient approximate to that of the Si chips 1a, 1b approaches the strain of the radiation members 2, 3 as a whole to Si, so that stress applied to the Si chips 1a, 1b can be lowered.

Accordingly, the semiconductor device can be provided with high reliability to the bonding strengths between the Si chips 1a, 1b and the radiation members 2, 3 and without breakage of the Si chips 1a, 1b while securing the same effects as those in the first embodiment. Incidentally, the other features not described in this embodiment are substantially the same as those in the first embodiment. The partially disposed metallic members 16 need not be provided at the entire region of each radiation member 2 or 3 connected to the Si chips 1a, 1b. The partially disposed metallic members 16 should be disposed at necessary positions appropriately. Also, in this embodiment, the space 15 may be formed in at least one of the first side and second side radiation members 2, 3 as in the second embodiment.

(Fourth Embodiment)

Figure 7:
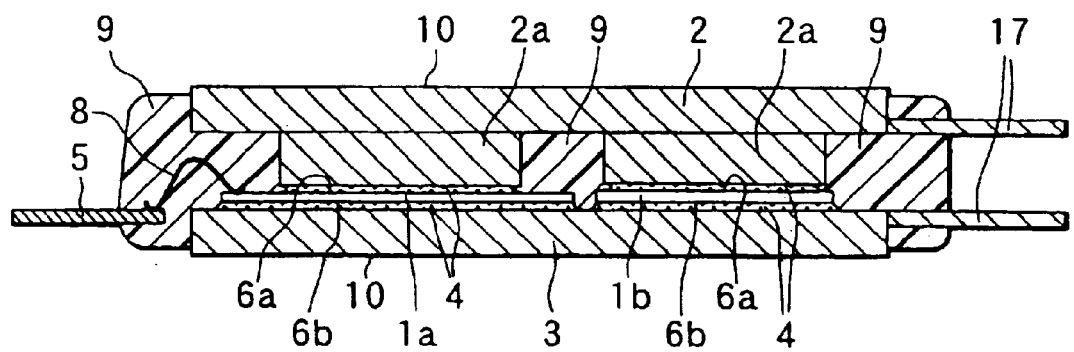
FIG. 7 is a cross-sectional view showing a semiconductor device in a fourth preferred embodiment.

FIG. 7 shows a semiconductor device in a fourth preferred embodiment. This embodiment relates to a modification of the outside wiring members 11 described in the first embodiment. Hereinafter, different portions from the first embodiment are mainly described, and in FIG. 7, the same parts as those in FIG. 2A are indicated by the same reference numerals. In FIG. 7, the high thermal conductivity insulating substrates 12 and the outside cooling members 13 are omitted.

As shown in FIG. 7, conductive terminals 17 connected to the principal electrodes of the Si chips 1a, 1b are taken out of edges of the first side and second side radiation members 2, 3 as main electrode terminals to be electrically connected to an outside. The conductive members 17 have the same function as that of the outside wiring members 11 shown in FIG. 2A.

The conductive members 17 protrude from the respective radiation members 2, 3 from approximately the same position with respect to the respective members 2, 3 and in an approximately identical direction that is perpendicular to the radiation surfaces 10. That is, the conductive members 17 are approximately parallel to each other, and accordingly can prevent a parasitic inductance described below. The root parts of the conductive members 17 are adjacent to each other. The semiconductor device shown in FIG. 7 dispenses with the outside wiring members 11 shown in FIG. 2A, and the radiation surfaces 10 contact the outside cooling members 13 with the high thermal conductivity insulating substrates 12 interposed therebetween, although they are not shown.

It is preferable that the respective radiation members 2, 3 and the respective conductive members 17 are integrated with each other in consideration of electrical resistance. However, when the conductive members 17 are separately formed and bonded to the radiation members 2, 3, screwing, welding, brazing, and soldering methods are conceivable for the bonding. At that time, the conductive members 17 can be made of various materials as long as it is superior in electrical conductivity.

According to the present embodiment, the same effects as those in the first embodiment can be exhibited. In addition, because electrical connection with the outside can be made via the conductive members 17, it is not necessary to connect the outside wiring members 11 to the radiation surfaces 10 of the radiation members 2, 3. As a result, as compared to the case where the outside wiring members 11 are used, the number of connecting interfaces in the direction in which heat is transferred is reduced to reduce heat resistance at the connecting interfaces. Therefore, the radiating property is further improved. In addition, the thickness of the semiconductor device in the thickness direction of the Si chips 1a, 1b can be reduced, resulting in size reduction of the semiconductor device.

As a more preferable configuration, in the present embodiment, the conductive members 17 are provided to be approximately parallel to each other at adjacent positions, and in the semiconductor device, currents flow in the respectively conductive members 17 with the same intensity in directions inverse to each other. When currents flow in the adjacent parallel conductive members in the inverse directions to each other, magnetic fields produced around the conductive members are canceled with each other. As a result, the parasitic inductance can be significantly suppressed.

Also in the present embodiment, as in the first embodiment, the radiation members are made of a metallic material containing Cu or Al as a main component when the object of the invention is to improve the radiation property and the electrical conductivity. In this case, because workability of Cu and Al is good, the conductive members 17 can be easily formed by pressing, cutting, or the like.

The other features not described in the present embodiment are substantially the same as those in the first embodiment. In the present embodiment, although the conductive members 17 are adjacent to and approximately parallel to each other, the conductive members 17 are not limited to that, but may protrude from the respective radiation members in different directions from each other. Also when the radiation members 2, 3 use a material having high hardness such as W or Mo to easily seal the several semiconductor chips with resin, the conductive members 17 are preferably formed as separate members because they are difficult to be integrally formed with the radiation members 2, 3.

(Fifth Embodiment)

Figure 8A:
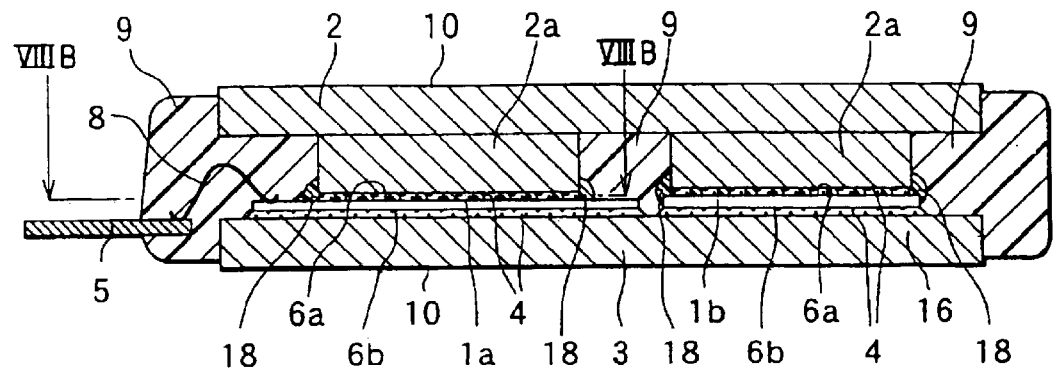
FIG. 8A is a cross-sectional view showing a semiconductor device in a fifth preferred embodiment.
Figure 8B:
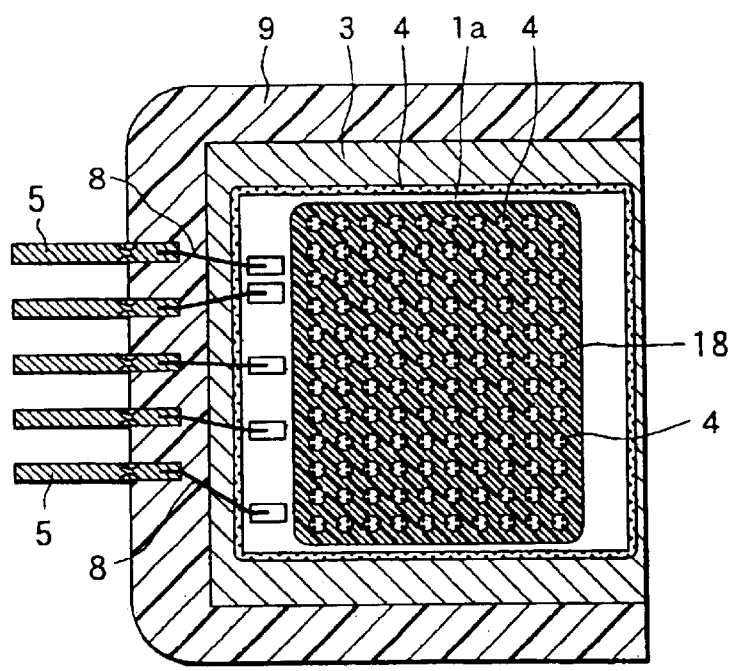
FIG. 8B is a cross-sectional view taken along line VIIIB—VIIIB in FIG. 8A.

FIGS. 8A and 8B show a semiconductor device in a fifth preferred embodiment, in which the outside wiring members 11, the high thermal conductivity insulating substrates 12, and the outside cooling members 13 shown in FIG. 2A are omitted. The present embodiment differs from the first embodiment in the connecting method between the Si chips 1a, 1b and the first side radiation member 2. Hereinafter, different portions from the first embodiment are mainly explained and in FIGS. 8A and 8B the same parts as those in FIG. 2A are assigned to the same reference numerals.

As shown in FIGS. 8A and 8B, bump-shaped bonding members 4 are uniformly provided between the principal electrodes on the principal surfaces 6a of the Si chips 1a, 1b and the first side radiation member 2, and spaces provided among the bonding members 4 are filled with resin 18. The resin 18 has material properties similar to those of metal such as good wettability, and prevents stress concentration on the bump-shaped bonding members 4. Hereinafter, the resin is referred to as RAB (Resist Assist Bonding) resin 18. The RAB resin 18 is specifically composed of epoxy based resin mixed with silica fillers.

To form the constitution described above, like the semiconductor device in the first embodiment, after the Si chips 1a, 1b are connected to the second side radiation member 3 and the wire bonding are carried out, the bonding members 4 are formed in bump shapes on the principal electrodes of the Si chips 1a, 1b at the side of the first surfaces 6a, and connected to the first side radiation member 2.

Successively, the RAB resin 18 is put in an injector, and is injected into the spaces provided among the bump-shaped bonding members 4. At that time, even when the resin is not injected into all the spaces directly, the spaces can be filled with the resin due to a capillary tube phenomenon. After that, as described above, the integrated Si chips 1a, 1b and the radiation members 2, 3 are put in the die, and are sealed with the resin 9 integrally.

According to the present embodiment, the same effects as those in the first embodiment can be attained. Further, the RAB resin 18 can restrict plastic deformation of the bonding members 4. Furthermore, the RBA resin 18 can prevent cracks, which are produced in the bonding members 4 due to thermal stress, from progressing. That is, the RBA resin 18 strengthens the bonding between the Si chips 1a, 1b and the first side radiation member 2, and increases the reliability in connection.

The features not described in the present embodiment are substantially the same as those in the first embodiment. Also in the present embodiment, small bumps are arranged uniformly; however, smaller number of bumps with larger size than those in the present embodiment may be arranged. Although the bump-shaped bonding members 4 are adopted for bonding the Si chips 1a, 1b to the first side radiation member 2 in the present embodiment, they may be adopted for bonding the Si chips 1a, 1b to the second side radiation member 3. If the mold resin 9 can be injected into the spaces among the bumps to fill them completely, it is not necessary to inject the RBA resin 18 previously. In this case, the mold resin 9 filling the spaces among the bumps works as the RBA resin 18. The second to fourth embodiments can be applied to the present embodiment appropriately.

(Sixth Embodiment)

Hereinafter, sixth to ninth embodiments are described as first to fourth modified examples of the embodiments described above, which are applicable to the above respective embodiments, and some of which may be combined with each other to be applied to the above respective embodiments.

Figure 9A:
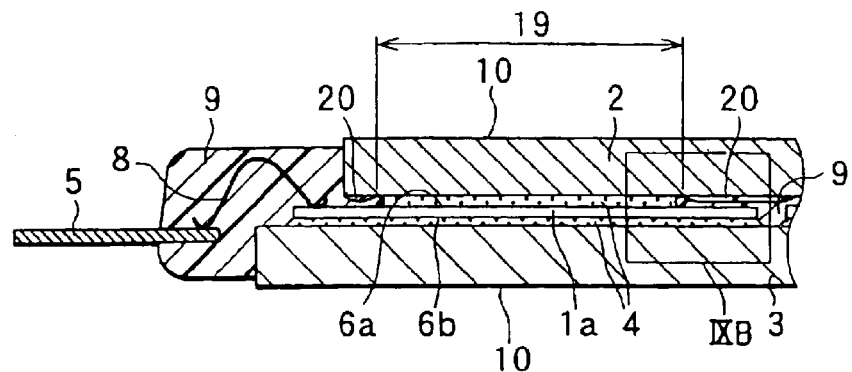
FIG. 9A is a cross-sectional view showing a semiconductor device in a sixth preferred embodiment.
Figure 9B:
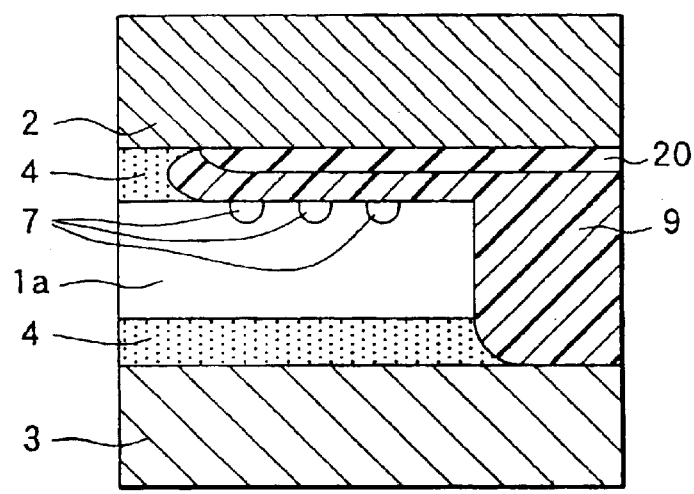
FIG. 9B is an enlarged cross-sectional view showing a part indicated by arrow IXB in FIG. 9A.
Figure 9C:
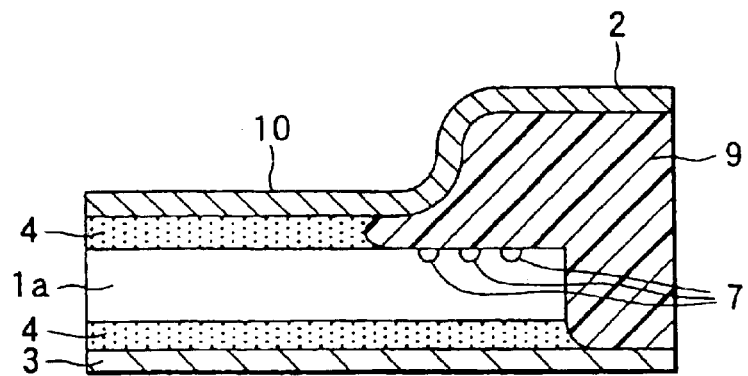
FIG. 9C is a cross-sectional view showing an example in the sixth embodiment.

First, the sixth embodiment is explained referring to FIGS. 9A to 9C. In the above embodiments, the first side radiation member 2 is formed with the protruding portions 2a; however, as indicated by an arrow F in FIG. 2B, because the first side radiation member 2 is thickened at the protruding portions 2a, its rigidity is increased. The larger the rigidity of the first side radiation member 2 is, larger compressive stress is applied to the Si chips 1a, 1b.

To reduce the rigidity, a method shown in FIG. 9C is conceivable, in which the first side radiation member 2 is formed by embossing a sufficiently thinned metallic plate to have a protruding portion for avoiding an insulated region, and is bonded to the Si chips 1a, 1b with a decreased rigidity. However, in this method, because the radiation surface 10 of the first side radiation member 2 is not flat, it is difficult to contact the outside wiring member 11 and the outside cooling member 13.

In this connection, in this embodiment, as shown in FIGS. 9A and 9B, an insulating film 20 is formed on the first side radiation member 2, with an opening pattern 19 opened at regions corresponding to the inner sides of the Si chips 1a, 1b than the peripheral portions of the chips 1a, 1b where the guard rings 7 are provided. In other words, the insulating film 20 is formed at regions corresponding to the insulated regions in FIG. 2B, and opened at regions corresponding to the principal electrodes of the Si chips 1a, 1b at the side of the first surfaces 6a.

The insulating film 20 is preferable to be close without pinholes, and is necessary to withstand thermal contraction of the radiation member 2. A film made of polyimide or glass is applicable to such an insulating film 20. When the semiconductor device in this embodiment is manufactured, after the insulating film 20 is formed on the radiation member 2, the Si chips 1a, 1b are bonded to the radiation member 2 at the side of the first surfaces 6a. The other steps are substantially the same as those for the semiconductor device in the first embodiment.

According to the method described above, the guard rings 7 can be electrically insulated from the first side radiation member 2 by the insulating film 20. The radiation member 2 can be formed in a plate shape without a protruding portion 2a for avoiding the guard rings 7 of the Si chips 1a, 1b. In this case, the rigidity of the radiation member 2 can be reduced by the decreased thickness of the radiation member 2 as far as the radiation property is allowed. As a result, the compressive stress applied to the Si chips 1a, 1b can be mitigated.

When the first side and second side radiation members 2, 3 do not have any protruding portions, it can be suitably adopted in cases of one Si chip, and several Si chips having an identical thickness with each other. Even when the several Si chips are different from one another in thickness, there is no problem if the difference in thickness can be absorbed by the amounts of the bonding members 4.

The other features not described in this embodiment are substantially the same as those in the first embodiment. In this embodiment, the insulating film 20 is formed on the first side radiation member 2; however, it may be formed on the second side radiation member 3. If there is a region not filled with the resin 9 for sealing, the insulation could not be securely attained by the resin 9. However, the insulation can be securely provided by the insulating film 20 if it is formed on the region in advance. This prevention by the insulating film 20 can be applied to the case where the radiation member 2 has the protruding portions 2a as well.

(Seventh Embodiment)

Figure 10:
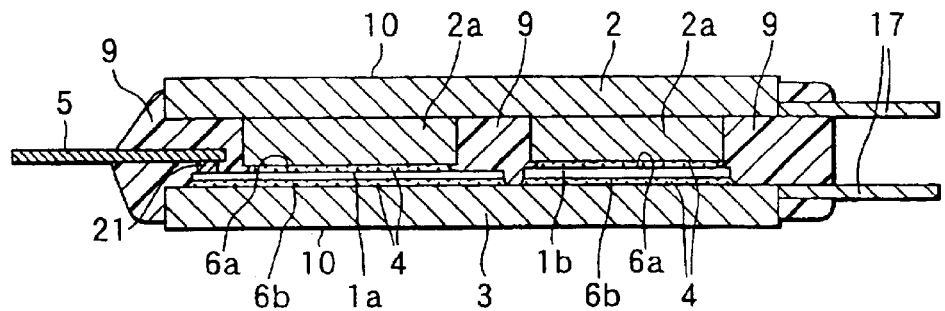
FIG. 10 is a cross-sectional view showing a semiconductor device in a seventh preferred embodiment.

Next, the seventh embodiment is described as a second modified example referring to FIG. 10. In this embodiment, the electrical connecting method between the control terminal 5 and the control electrode of the Si chip 1a differs, and FIG. 10 shows an example in which the present embodiment is applied to the fourth embodiment (FIG. 7). Hereinafter, different portions from those in FIG. 7 are mainly discussed, and in FIG. 10 the same parts as those in FIG. 7 are assigned to the same reference numeral.

As shown in FIG. 10, the electrical connection between the control electrode and the control terminal 5 is provided by a bump 21 that is made of, for example, solder, brazing filler metal, conductive adhesive, or the like. According to this modified example, the wire bonding step needs not be performed, and the control terminal 5 can be bonded simultaneously with the bonding between the Si chips 1a, 1b and the radiation members 2, 3. Thus, the manufacturing process can be simplified. Also, wire flow of wire bond does not occur during the resin sealing.

(Eighth Embodiment)

Figure 11:
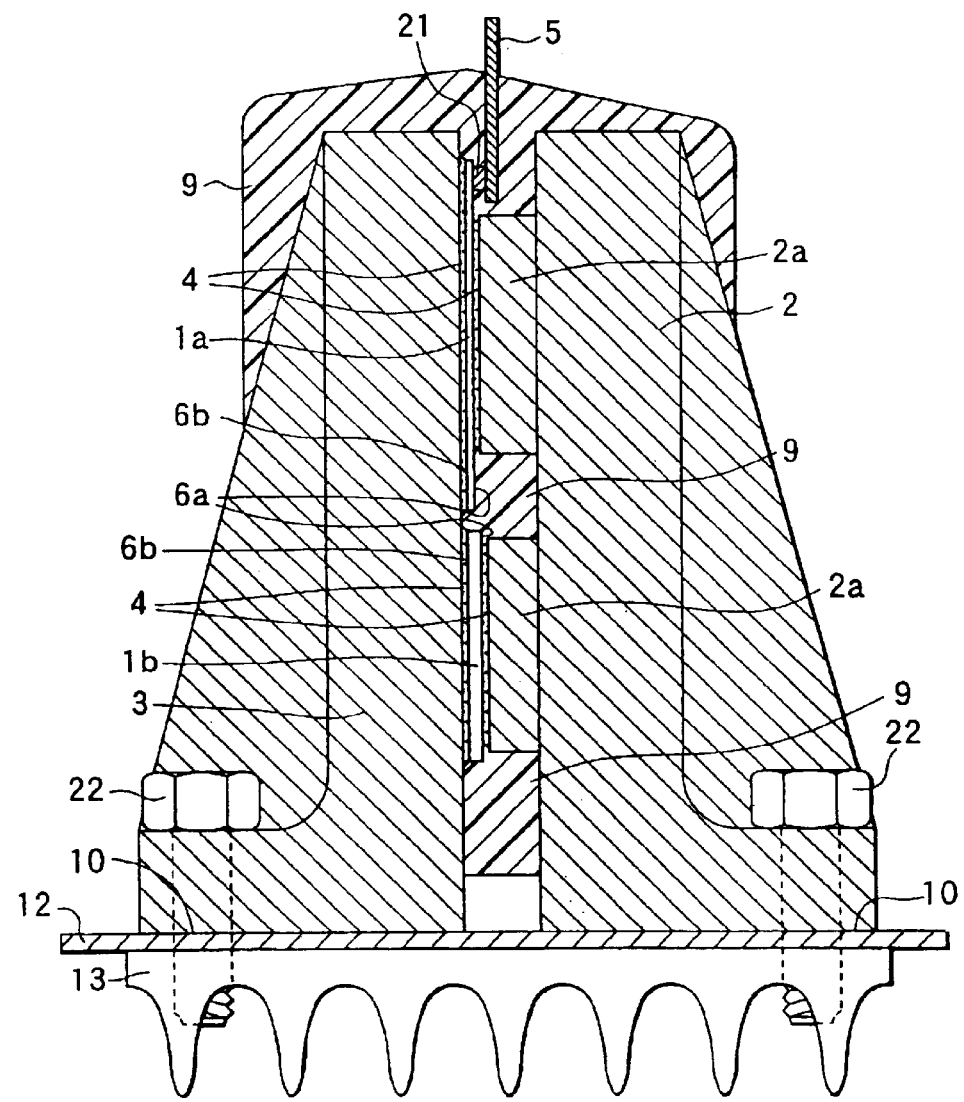
FIG. 11 is a cross-sectional view showing a semiconductor device in an eighth preferred embodiment.

Next, the eighth embodiment is described as a third modified example referring to FIG. 11. In this embodiment, the locations of the radiation surfaces 10 differ. FIG. 11 is an example in which the present embodiment is applied to the semiconductor device that is provided by combining the first embodiment and the seventh embodiment being the second modified example. Hereinafter, different portions from those in FIGS. 2A and 10 are mainly described, and in FIG. 11 the same parts are assigned to the same reference numerals.

As shown in FIG. 11, in this embodiment, each of the first side and second side radiation members 2, 3 has a wedge shaped cross-section, and the protruding portions 2a are formed on the first side radiation member 2. A side face of the first side radiation member 2 and a side face of the second side radiation member 3 (disposed at a lower side in the figure) serve as the radiation surfaces 10. The radiation surfaces 10 of the first side and second side radiation members 2, 3 are approximately perpendicular to the connecting surfaces of the radiation members 2, 3 being connected to the Si chips 1a, 1b, and are coplanar with each other. The radiation surfaces 10 contact the outside cooling member 13 via the high thermal conductivity insulating substrate 12, and are fixed by insulating volts 22.

According to the present embodiment, because there is no need to prepare two outside cooling members 13, the flexibility for assembling the semiconductor device with the outside cooling member 13 is improved. For example, the semiconductor device of the present invention is replaceable with a conventional cooling system having a cooling part at only one side. In addition, because the number of the high thermal conductivity insulating substrates 12 can be reduced to one, the cost of parts can be reduced.

In the present embodiment, although the radiation surfaces 10 are perpendicular to the connecting surfaces of the radiation members 2, 3 with the Si chips 1a, 1b, they can be attached to various types of outside cooling members by changing the angle appropriately. When the conductive members described in the fourth embodiment are used, the conductive members can be taken out of side faces of the radiation members 2, 3 different from the radiation surfaces 10.

(Ninth Embodiment)

Figure 12:
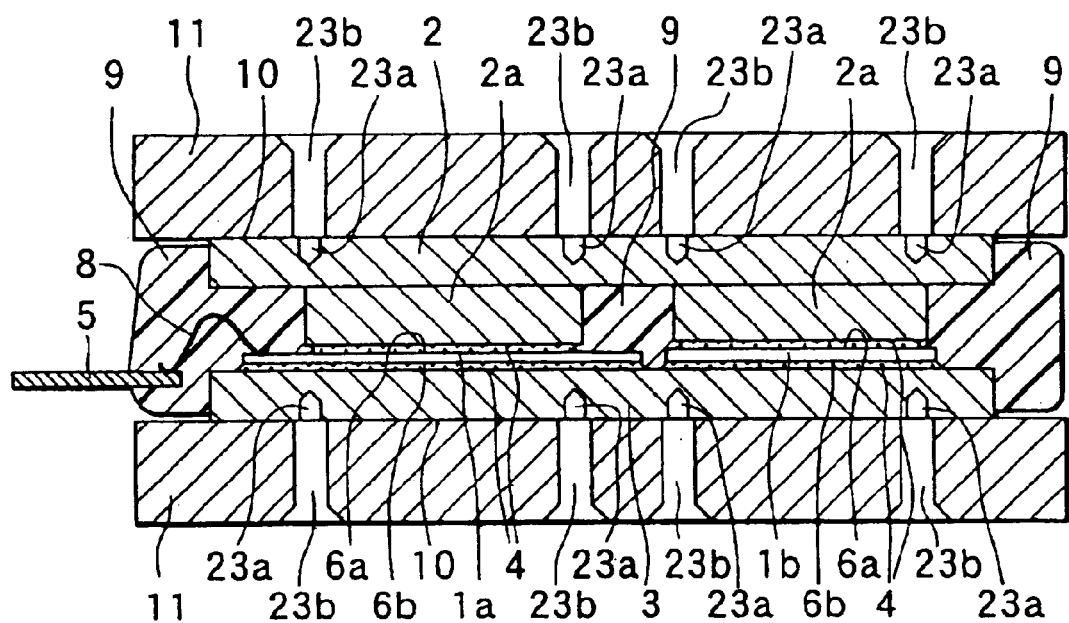
FIG. 12 is a cross-sectional view showing a semiconductor device in a ninth preferred embodiment.

Next, the ninth embodiment is explained as a fourth modified example with reference to FIG. 12. This embodiment differs in the fixing method of the outside wiring members 11. Hereinafter, different portions from those in FIG. 2A are mainly described, and the same parts as those in FIG. 2A are assigned to the same reference numerals in FIG. 12.

As shown in FIG. 12, each four screw holes 23a are formed in the respective first side and second side radiation members 2, 3 from the radiation surfaces 10 not to reach the Si chips 1a, 1b. Each of the outside wiring members 11 has four screw holes 23b penetrating it and corresponding to the screw holes 23a. Then, screws (not shown) are inserted into the screw holes 23a, 23b from surfaces of the outside wiring members 11 at an opposite side of the respective radiation surfaces 10. Accordingly, the radiation members 2, 3 and the outside wiring members 11 are fixed together. Here, the screw holes 23a, 23b are formed by a drill or the like.

According to this embodiment, because the radiation members 2, 3 have the screw holes 23a not penetrating them, the screws do not contact the Si chips 1a, 1b, and the screw holes 23a, 23b can be formed at arbitrary positions. Also, because the fixation is achieved by the screws, even when the pressure for fixing the outside wiring members 11 to the respective radiation members 2, 3 is increased, no pressure is applied to the Si chips 1a, 1b. As a result, the contact resistances between the radiation members 2, 3 and the outside wiring members 11 can be reduced, and the radiation property and the electrical conductivity can be improved.

Especially, the screw fixation can be performed at the positions of the second side radiation member 3 immediately under the Si chips 1a, 1b. Therefore, thermal and electrical connection between the Si chips 1a, 1b and the second side radiation member 3 can be secured. The thermal connections of the semiconductor device to which the outside wiring members 11 are screwed, and the high thermal conductivity insulating substrates 12 and the outside cooling members 13 can be provided, for example, substantially in the same manner as in the first embodiment. One screw hole 23a or 23b is sufficient for each of the members 2, 3, and 11 to perform the fixation described above. This embodiment is applicable to the above embodiments except the third modified example.

(Tenth Embodiment)

Figure 13:
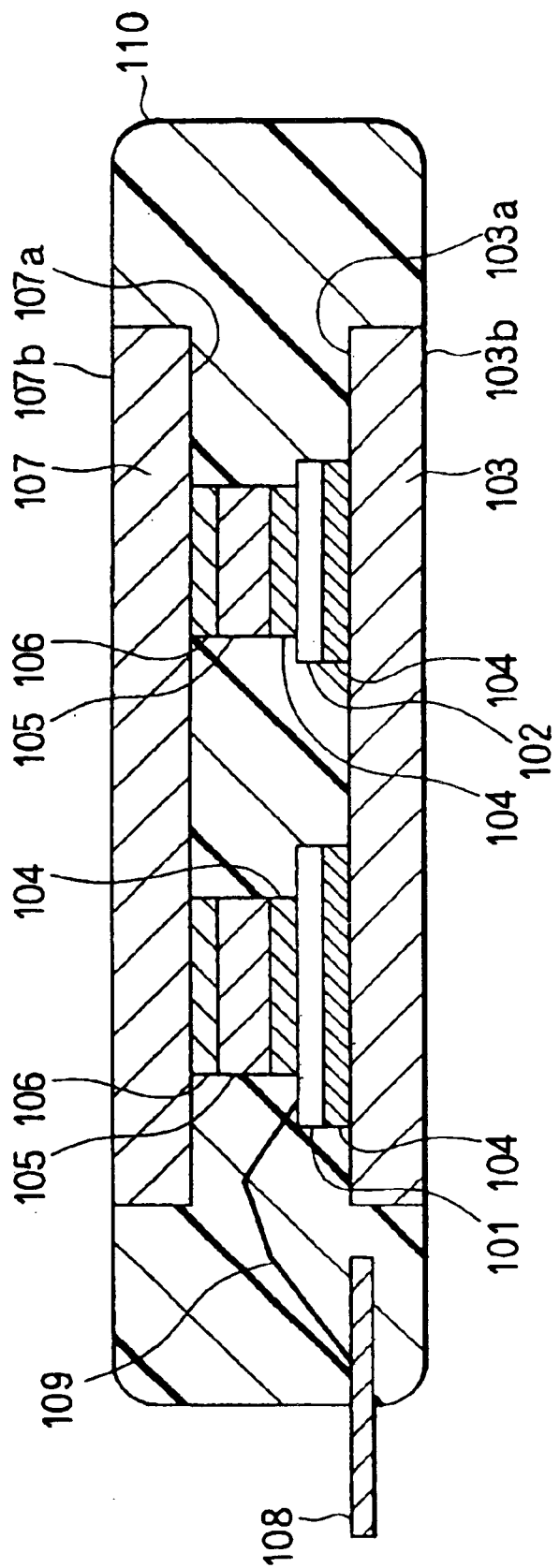
FIG. 13 is a cross-sectional view showing a semiconductor device in a tenth preferred embodiment.

A semiconductor device in a tenth preferred embodiment is explained with reference to FIG. 13. This embodiment is made to improve a degree of parallelization between two lead (radiation) members sandwiching a semiconductor element therebetween. Specifically, the semiconductor device includes an IGBT element 101 and a diode 102 that form a circuit as semiconductor elements. The semiconductor elements 101, 102 are bonded to a surface 103a of a plate-shaped first lead member (first conductive member) 103 made of, for example, cupper, through first soldering members 104 composed of 10 wt % Sn (tin) and 90 wt % Pb (lead) and having a fusing point of 320° C. Block-shaped heat sinks 105 made of copper are respectively bonded to the semiconductor elements 101, 102 through the first soldering members 104.

On the heat sinks 105, a second lead member (second conductive member) 107 made of copper or the like is bonded at a surface 107a thereof through second soldering members 106 having a fusing point lower than that of the first soldering members 104. The second soldering members 6 contain, for example, Sn at 90 wt % or more, and have the fusing point of 240° C.

The surface 103a of the first lead member 103 and the surface 107a of the second lead member 107 face each other with the semiconductor elements 101, 102 interposed therebetween, and extend approximately in parallel with each other (for example, an inclination between the lead members 103, 107 is 0.1 mm or less). Also, in this semiconductor device, an outer lead 108 and the IGBT element 101 are electrically connected to each other by a bonding wire 109 made of Au or Al for electrical connection with an outside.

The members 101 to 109 assembled as above are encapsulated and sealed with mold resin 110 composed of, for example, epoxy resin, and accordingly are protected from external environment. The other surfaces 103b, 107b of the lead members 103, 107 are exposed from the mold resin 110, and serve as radiation surfaces.

Thus, in this semiconductor device, the circuit is composed of the two semiconductor elements 101, 102, and the two lead members 103, 107 serve as electrodes simultaneously. Signal communication between the semiconductor elements 101, 102 and the outside is performed through the lead members 103, 107, the wire 109, and the outer lead 108. The lead members 103, 107 also serve as radiation members, and facilitate heat radiation by, for example, disposing cooling members (not shown) on the surfaces 103b, 107b through insulating members.

Figure 14A:
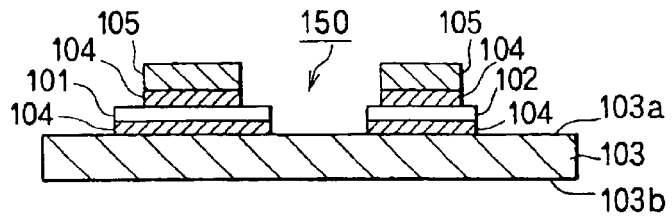
FIGS. 14A to 14C are cross-sectional views showing a method for manufacturing the semiconductor device shown in FIG. 13 in a stepwise manner.
Figure 14B:
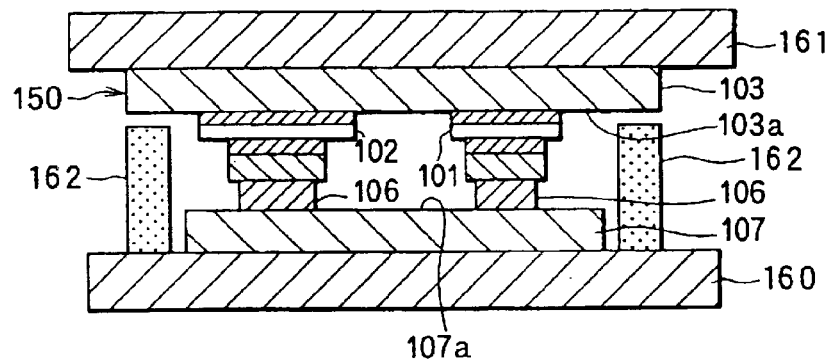

Next, a method for manufacturing the semiconductor device in the present embodiment is explained with reference to FIGS. 14A to 14C. First, the semiconductor elements 101, 102 are bonded to the surface 103a of the first lead member 103 through the first soldering members 104. Next, the heat sinks 105 are respectively bonded to the first and second semiconductor elements 101, 102, also through the first soldering members 104. This state is shown in FIG. 14A. These integrated members are referred to as a work 150.

Next, the surface 107a of the second lead member 107 is bonded to the semiconductor elements 101, 102 to which the heat sinks 105 are bonded, through the second soldering members 106 having a lower fusing point. Specifically, as shown in FIG. 14B, the second lead member 107 is disposed on a jig 160 with the surface 107a facing upward, and the second soldering members 106 are disposed on predetermined positions of the surface 107a. Then, the work 150 shown in FIG. 14A is turned over, and disposed on the surface 107a of the second lead member 107 through the second soldering members 106.

Further, a plate-shaped weight 161 made of stainless or the like is put on the other surface 103b of the first lead member 103. The jig 160 is equipped with a spacer 162 having a specific height (for example, 1 mm) made of carbon or the like for determining the gap between the two lead members 103, 107. This state is shown in FIG. 14B. Then, the members are put in a heating furnace in this state, and only the second soldering members 106 undergo reflow.

Figure 14C:
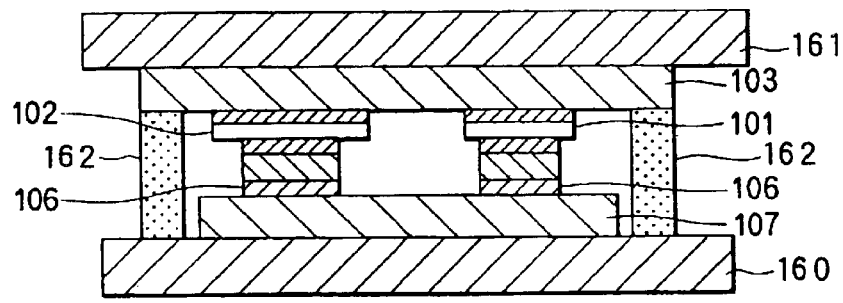

Accordingly, the work 150 is pressurized by the weight 161, and as shown in FIG. 14C, the second soldering members 106 are crushed and the gap between the two lead members 103, 107 is decreased to the height of the spacer 162. Accordingly, the degree of parallelization between the two lead members 103, 107 is controlled. Incidentally, when the fusing points of the first soldering members 104 and the second soldering members 106 are respectively 320° C. and 240° C., a reflow temperature is 250° C., and a load imparted from the weight 161 to the work 150 is 0.08 g/mm$^2$ in this embodiment.

The thickness of the second soldering members 106 is preferably about 100 μm to 300 μm. When it is too thin, the thickness for controlling the degree of parallelization between the two lead members 103, 107 becomes insufficient. When it is too thick, the thermal conductivity between the semiconductor elements and the lead members becomes insufficient. Further, the second soldering members 106 containing Sn at 90 wt % or more is advantageous to secure a sufficient thermal conductivity. Incidentally, after that, wire bonding with the outer lead 108 and resin molding are performed. As a result, the semiconductor device shown in FIG. 13 is completed.

According to the manufacturing method described above, in the work 150 in which the both surfaces of the semiconductor elements 101, 102 are sandwiched by the first and second lead members (radiation members) 103, 107 through the first and second soldering members 104, 106, because the second soldering members 106 has a fusing point lower than that of the first soldering members 104, reflow can be performed only to the second soldering members 106.

Then, in this state, pressure is applied from the upper side of the first lead member 103 (or second lead member 107), so that the second soldering members 106 are deformed in the sate where the semiconductor elements 101, 102 are supported by the first soldering members 104. Accordingly, the degree of parallelization between the two lead members 103, 107 can be controlled. For example, the degree of parallelization between the two lead members 103, 107 can be made equal to or less than 0.1 mm.

Thus, according to the present embodiment, the semiconductor device having an appropriate degree of parallelization between the two members 103, 107 can be provided. In FIG. 13, the semiconductor device can dispense with the mold resin 10. In such a case, the degree of parallelization between the two members 103, 107 can be controlled easily.

Figure 15:
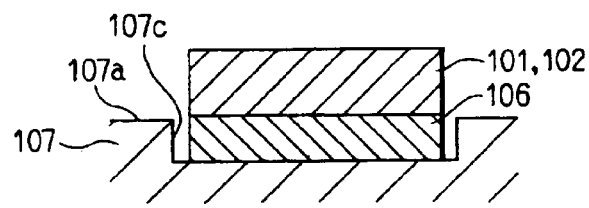
FIG. 15 is a cross-sectional view schematically showing a second lead member and a soldering member as a modified example of the tenth embodiment.

Also, as shown in FIG. 15, the second lead member 107 can have recess portions 107c (for example, having a depth of about 0.1 mm) on the surface 107a, and the second soldering members 106 can be disposed in the recess portions 107c. In this case, even when the second soldering members 106 are crushed during the reflow and pressurization so as to extrude, the recess portions 107c prevent the soldering members 106 from bulging out. Further, when the soldering members 106 are composed of soldering foils, the positioning becomes easy.

The second lead member 107 may be bonded to the semiconductor elements 101, 102 through the second soldering members 106 without the heat sinks 105. The present embodiment relates to the semiconductor device in which the semiconductor element is sandwiched by the pair of conductive members through the soldering members, and the conductive members may have only one of a radiation function and an electrode function.

(Eleventh Embodiment)

Figure 16:
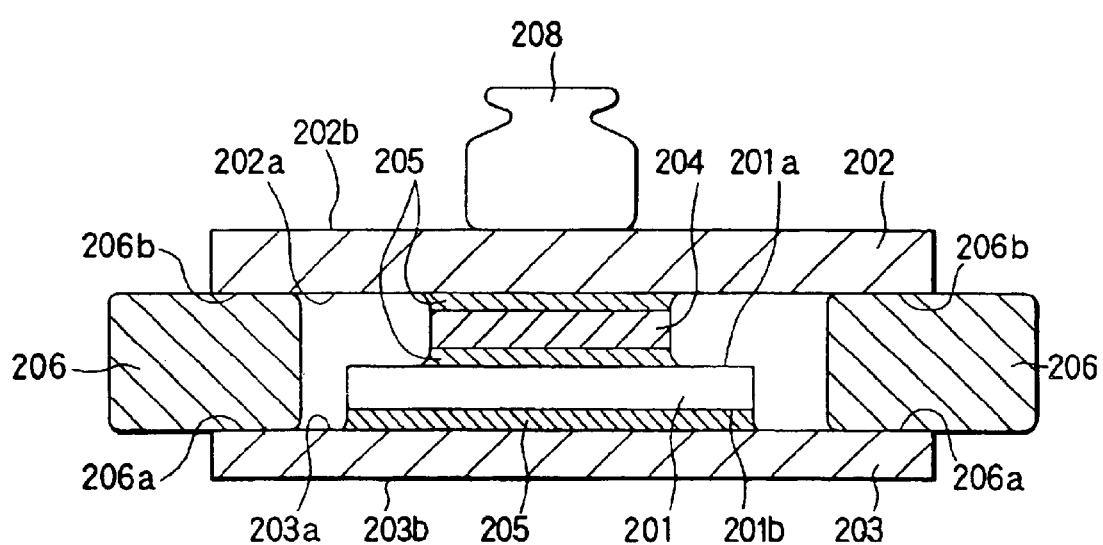
FIG. 16 is a cross-sectional view schematically showing a method for manufacturing a semiconductor device in an eleventh preferred embodiment.

In an eleventh preferred embodiment, the present invention is applied to a semiconductor device as an electronic instrument shown in FIG. 16. The semiconductor device is, as shown in FIG. 16, composed of a heating element 201 and a pair of radiation members 202, 203 for radiating heat from the heating element 201. On a surface 201a of the heating element 201, a first side radiation member 202 is bonded through a radiation block 204 and a bonding member 205, while on the other surface 201b of the heating element 201, a second side radiation member 203 is bonded through a bonding member 205. That is, the radiation members 202, 203 sandwich the semiconductor element 201 through the bonding members 205.

In this embodiment, the heating element 201 is a power semiconductor element such as an IGBT or a thyristor. The bonding members 205 are made of solder. The first side and second side radiation members 202, 203, and the radiation block 204 are made of Cu. Each plane shape of the members 201 to 204 is generally rectangular.

Next, a method for manufacturing the semiconductor device is explained. First, the semiconductor element 201, the first side and second side radiation members 202, 203, and the radiation block 204 are prepared. Each of the first side and second side radiation members 202, 203 has an area in a plane direction larger than those of the semiconductor element 201 and the radiation block 204.

Then, after solder paste is coated to the vicinity of the center on the surface 203a of the second side radiation member 203, the semiconductor element 201 is disposed thereon. Then, likewise, semiconductor paste is coated on the semiconductor element 201, and the radiation block 204 is disposed thereon. Solder paste is further coated on the radiation block 204.

Next, as shown in FIG. 16, a jig 206 for fixing the distance between the first side and second side radiation members 202, 203 is prepared. The jig 206 has a pair of surfaces (parallel surfaces) 206a, 206b parallel with each other. The jig 206 is so disposed on the second side radiation member 203 that the surface 6a contacts the surface 203a of the second side radiation member 203 where the semiconductor element 201 is not disposed. Here, the jig 206 is made of a material such as Al, having a thermal expansion coefficient larger than that of the first side and second side radiation members 202, 203 made of Cu.

Then, the first side radiation member 202 is disposed on the solder paste applied to the radiation block 204 and on the surface 206b of the jig 206, and a load is applied from the upper surface 202b of the first side radiation member 202 by, for example, a weight 208 as required. Accordingly, the first side radiation member 202 is externally pressurized so that the surface 202a of the first side radiation member 202 abuts the jig 206.

After that, the members 201 to 204 laminated as above undergo reflow in this state, so that the solder paste is hardened to be solder 205, and the semiconductor element 201, the radiation block 204, and the first side and second side radiation members 202, 203 are bonded together. Successively, the weight 208 is removed, and the jig 206 is removed by pulling it in the lateral direction. As a result, the semiconductor device in the present embodiment is completed.

According to the present embodiment, the distance between the surfaces (inner surfaces) 202a, 203a of the first side and second side radiation members 202, 203 facing the semiconductor chip 201 can be controlled by the thickness of the jig 206. As a result, when the members 201 to 204 are assembled with each other by lamination, there is no need to consider dimensional tolerances of the first side and second side radiation members 202, 203. Therefore, there is no need to thicken the solder 205 to absorb the dimensional tolerances of the first side and second side radiation members 202, 203. In consequence, the semiconductor device can be provided with a solder thickness decreased as small as possible.

Besides, in general, the respective members expand by heating during the reflow, and contract by cooling. The change in shape caused by this expansion and contraction becomes large as the thermal expansion coefficient becomes large. In this embodiment, because the thermal expansion coefficient of the jig 206 is large as compared to those of the first side and second side radiation members 202, 203 and the radiation block 204, after the members 201 to 204 are bonded together by the solder 205 hardened in the sate where the respective members 201 to 204 expand at the reflow, the jig 206 contracts much more than the other members 201 to 204 when returned to a room temperature.

As a result, the gap between the surfaces 202a, 203a of the first side and second side radiation members 202, 203 becomes larger than that between the parallel surfaces 206a, 206b of the jig 206. Because of this, the jig 206 can be detached readily. Also, because the degree of parallelization between the first side and second side radiation members 202, 203 can be controlled by the parallel surfaces 206a, 206b of the jig 206, the degree of parallelization between the first side and second side radiation members 202, 203 can be secured even when the thickness of the solder 205 is reduced.

Although the present embodiment exemplifies the case where the thermal expansion coefficient of the jig 206 is larger that those of the other members 202 to 204, if the jig 206 can be detached after the members 201 to 204 are bonded together, the jig 206 is not limited in the thermal expansion coefficient. The shape of the jig 206 is not limited to that shown in the figure, but may be other shapes so long as the jig 206 can determine the distance between the first side and second side radiation members 202, 203.

The solder 205 is used as the bonding member, and is formed by hardening solder paste at reflow. However, the bonding may be performed by interposing solder sheets between laminated members, and fusing and hardening the solder sheets. Conductive adhesive may be used alternatively.

The order of disposals of the semiconductor element 201, the radiation block 204, solder paste, and the jig 206 on the second side radiation member 203 are not limited to that described above, and is changeable provided that the constitution shown in the figure can be obtained. It is described that the jig 206 has the parallel surfaces 206a, 206b; however, the surfaces 206a, 206b need not be always parallel to each other provided that the jig 206 can fix the distance between the surface 202a of the first side radiation member 202 and the surface 203a of the second side radiation member 203. For example, the jig 206 can have at least three protrusions at portions contacting the first side and second side radiation members 202, 203.

Also, although it is not shown, in a case where a pad formed on the surface of the semiconductor element 201 is wire-bonded to a lead frame, for example, the wire bonding can be performed after the jig 206 is detached from the members bonded together. In this case, if the semiconductor element 201 is disposed in the vicinity of the edge portion of the second side radiation member 203, there is a case where the wire-bonding can be performed easily; however, the shape of the second side radiation member 203 can be modified appropriately so that the wire bonding to the pad becomes easier.

Further, the following method can be considered. Specifically, after the pad of the semiconductor element 201 is wire-bonded to the lead frame by a wire, the jig 206 is disposed on the first side radiation member to avoid the wire and the lead frame, and then the second side radiation member is disposed. In this state, the members 201 to 204 can be bonded. The semiconductor device in this embodiment may be sealed with resin. Also, the radiation members 202 to 204 may be made of ceramic substrates having metallized surfaces.

(Twelfth Embodiment)

Figure 17:
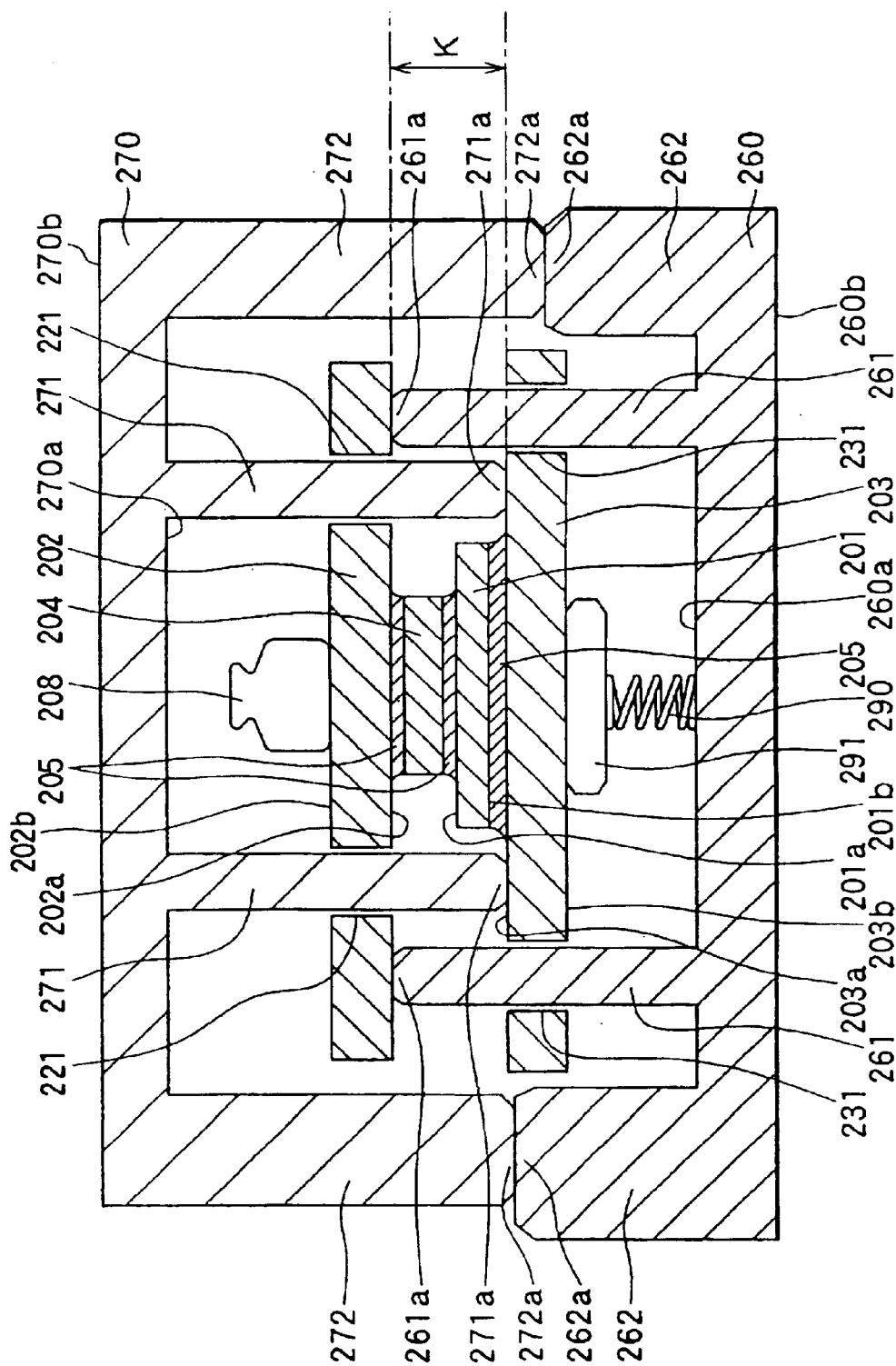
FIG. 17 is a cross-sectional view schematically showing a method for manufacturing a semiconductor device in a twelfth preferred embodiment.

FIG. 17 schematically shows a method for manufacturing a semiconductor device in a twelfth preferred embodiment. This embodiment is substantially identical with the eleventh embodiment in the constitution of the semiconductor device, but differs in the method for manufacturing the semiconductor device. Specifically, the method for controlling the dimension between the surfaces 202a, 203a of the first side and second side radiation members 202, 203 differs form that in the first embodiment. The same parts as those in the eleventh embodiment are assigned to the same reference numerals.

In this embodiment, first, the first side and second side radiation members 202, 203, the radiation block 204, and the semiconductor element 201 are prepared. The first side and second side radiation members 202, 203 are formed with through holes 221, 231 penetrating in the thickness direction at the respective four corners on a plane. The through holes 221, 231 receive first and second protruding portions 261, 271 described below.

Further, first and second jigs 260, 270 are prepared. The jigs 260, 270 respectively have rectangular plate portions, and in the first jig 260, four first protruding portions 261 protrude from a surface 260a of the plate portion, and in the second jig 270, four second protruding portions 271 protrude from a surface 270a of the plate portion. The first and second protruding portions 261, 271 are provided approximately symmetrically, at inner portions than edge portions of the plate portions.

At the respective edge portions of the jigs 260, 270, protruding portions 262, 272 for positioning respectively protrude from the surfaces 260a, 270a for determining the distance between the first jig 260 and the second jig 270. The protruding portions 261, 262, 271, 272 have front end portions 261a, 262a, 271a, 272a each of which is a generally flat face. The first and second jigs 260, 270 are made of, for example, C (carbon).

Next, the surface 202a of first side radiation member 202 is disposed on the surface 201a of the semiconductor device 201 through the radiation block 204 and solder paste. On the other surface 201b of the semiconductor element 201, the second side radiation member 203 is disposed at the side of the surface 203a, through solder paste. That is, similarly to the eleventh embodiment, the second side radiation member 203, the semiconductor element 201, and the radiation block 204 are mounted through soldering paste, and the first side radiation member 202 is further mounted on the radiation block 204 through solder paste applied.

Then, the first jig 260 is disposed with the surface 260a facing upward, and a spring member 290 composed of a coil spring and a rectangular base 291 bonded to the end of the coil spring is disposed on the surface 260a. The other end of the coil spring 290 may be bonded to the surface 260a of the first jig 260, and may not be bonded thereto.

Then, the laminated members 201 to 204 are disposed on the first jig 260 so that the surface 203b of the second side radiation member 203 is supported by the base 290 of the coil spring 290 disposed on the surface 260a of the jig 260 and so that the first protruding portions 261 are inserted into the holes 231 formed in the second side radiation member 203. Then, the weight 208 is put on the surface 202b of the first side radiation member 202. The second jig 270 is positioned with the surface 270a facing downward, is approached to the surface 202b of the first side radiation member 202, and is installed so that the second protruding portions 271 are inserted into the holes 221 formed in the first side radiation member 202. Thus, the first side and second side radiation members 202, 203, the radiation block 204, and the semiconductor element 201 laminated as above are sandwiched by the first and second jigs 260, 270.

Successively, the front end portions 262a of the protruding portions 262 formed on the first jig 260 for positioning are made abut the front end portions 272a of the protruding portions 272 formed on the second jig 270 for positioning. Accordingly, a specific distance between the first and second jigs 260, 270 can be kept. That is, the distance becomes the sum of the lengths of the protruding portions 262, 272.

At that time, the front end portions 261a of the first protruding portions 261 abut the surface 202a of the first side radiation member 202, and the front end portions 271a of the second protruding portions 271 abut the surface 203a of the second side radiation member 203. Further, the first side and second side radiation members 202, 203 are pressurized from the surfaces 202a, 203a by the elastic force of the spring member 290 and the gravitational force of the weight 208.

Then, in the state where the respective members 201 to 204 are fixed by the first and second jigs 260, 270, solder is hardened by reflow, and the first side and second side radiation members 202, 203, the radiation block 204, and the semiconductor element 201 are bonded together through the solder 205. After that, the first jig 260 and the second jig 270 are pulled in upper and lower direction so that the members 201 to 204 bonded together can be detached from the jigs 260, 270. Thus, the semiconductor device is completed.

According to the present embodiment, the protruding portions 261, 271 can respectively be made abut the surfaces 202a, 203a of the first side and second side radiation members 202, 203 while keeping a constant distance between the first and second jigs 260, 270. Accordingly, the distance between the surfaces 202a, 203a of the first side and second side radiation members 202, 203 can be controlled. That is, referring to FIG. 17, the overlapping length K of the first and second protruding portions 261, 271 is kept constant. Also, the surfaces 202a, 203a of the first side and second side radiation members 202, 203 are respectively supported by the four first protruding portions 261, and the four second protruding portions 271. Therefore, the degree of parallelization between the first side and second side radiation members 202, 203 can be secured by controlling the lengths of the protruding portions 261, 271.

Therefore, there are no need to consider the dimensional tolerances of the first side and second side radiation members 202, 203, and no need to thicken the solder 205 for absorbing the dimensional tolerances of the first side and second side radiation members 202, 203. The manufacturing method in this embodiment can provide a semiconductor device in which the solder thickness is reduced as thin as possible.

Also, because the holes 221, 231 are formed in the first side and second side radiation members 202, 203, the front end portions 261a, 271a of the first and second protruding portions 261, 271 suitably abut the surfaces 202a, 203a of the first side and second side radiation members 202, 203 by penetrating the holes 231, 221. The insertions of the first and second protruding portions 261, 271 into the holes 231, 221 formed in the second side and first side radiation members 203, 202 can position the first side and second side radiation members 202, 203 in the horizontal direction, i.e., the direction parallel to the surfaces 202a, 203a.

Because the second side radiation member 203 is held by the spring member 290, the second side radiation member 203 can be suitably pressurized by the elasticity of the spring member 290 even when the dimensional error of the second side radiation member 203 is large. In addition, because the first side radiation member 202 is pressurized by the movable weight 208, the first side radiation member 202 can be suitably pressurized even when the dimensional error of the first side radiation member 202 is large.

Even when the radiation members 202, 203 are different from each other in thickness, the same jigs 260, 270 as described above can be used because the pressurization can be controlled by the spring member 290 and the weight 208, and because of the same reasons as described above involving the employments of the spring member 290 and the weight 208.

More specifically, for example, in the sate shown in FIG. 17, it is assumed that solid members having high rigidity are disposed in the gap between the first side radiation member 202 and the second jig 270, and in the gap between the second side radiation member 203 and the first jig 260 with heights corresponding to the gaps. In this case, if the thicknesses of the first side and second side radiation members 202, 203 are too thick, stresses applied to the first side and second side radiation members 202, 203 can be increased by interposing them between the front end portions 261a, 271a of the protruding portions 261, 271 and the solid members. This might result in breakage of the first side and second side radiation members 202, 203. On the other hand, if the thicknesses of the first side and second side radiation members 202, 203 are too thin, the front end portions 261a, 271a of the protruding portions 261, 271 could not abut the respective radiation members 202, 203. To the contrary, in this embodiment, the first side and second side radiation members 202, 203 can be pressurized suitably by adopting the spring member 290 and the weight 208.

Also, because it is so constructed that the semiconductor device can be detached from the jigs 260, 270 by detaching the jigs 260, 270 respectively in the upper and lower directions, the detachment is easy. The jigs 260, 270 need not have plate-like shapes, and can have various shapes as long as the first and second protruding portions 261, 271 are provided. To support the surfaces 202a, 203a of the first side and second side radiation members 202, 203, it is sufficient to provide three protruding portions 261 or 271 for each. The front end portions 261a, 262a, 271a, 272a of the protruding portions 261, 262, 271, 272 may not be flat.

The protruding portions 262, 272 for positioning may not be provided on the respective jigs 260, 270. For example, the second side radiation member may be formed with a long protruding portion for positioning with a front end portion that abuts the surface 260a of the jig 260, without forming the protruding portion for positioning on the first jig 260. Further, if an external apparatus or the like can fix the interval between the jigs 260, 270, there is no need to provide the protruding portions for positioning.

In the figure, only one semiconductor device is shown to be manufactured; however, several semiconductor devices can be manufactured at the same time by using first and second jigs having several pairs of first and second protruding portions. Although the holes 221, 231 for receiving the protruding portions 261, 271 are formed to penetrate the first side and second side radiation members 202, 203, notches notched from the edge portions of the radiation members 202, 203 and allowing the protruding portions 261, 271 to penetrate therein may be formed in place of the holes 221, 231.

Otherwise, for example, the first protruding portions 261 can pass through the outside of the second side radiation member 203 by decreasing the area of the second side radiation member 203. In this case, the holes 231 are not formed in the second side radiation member 203. The first side radiation member 202 has the through holes 221 for allowing the second protruding portions 271 to be inserted therein.

Otherwise, the respective radiation members 202, 203 may be warped or bent at edge portions so that the protruding portions 261, 271 can pass through with the front end portions 261a of the first protruding portions 261 abutting the surface 202a of the first side radiation member 202, and the front end portions 271a of the second protruding portions 271 abutting the surface 203a of the second side radiation member 203.

Although the weight 208 is disposed on the first side radiation member 202, the spring member 290 may be disposed between the surface 202b of the first side radiation member 202 and the surface 270a of the second jig 270. Although the spring member 90 is composed of a coil spring in this embodiment, it may be composed of other elastic members. Further, the front end portions 261a, 271a of the first and second protruding portions 261, 271 may be brought in contact with the radiation members 202, 203 when the reflow is performed to bond the members 201 to 204, by adopting a thermally deformable member such as a shape memory alloy, bimetal, or the like that deforms during the reflow.

Figure 18:
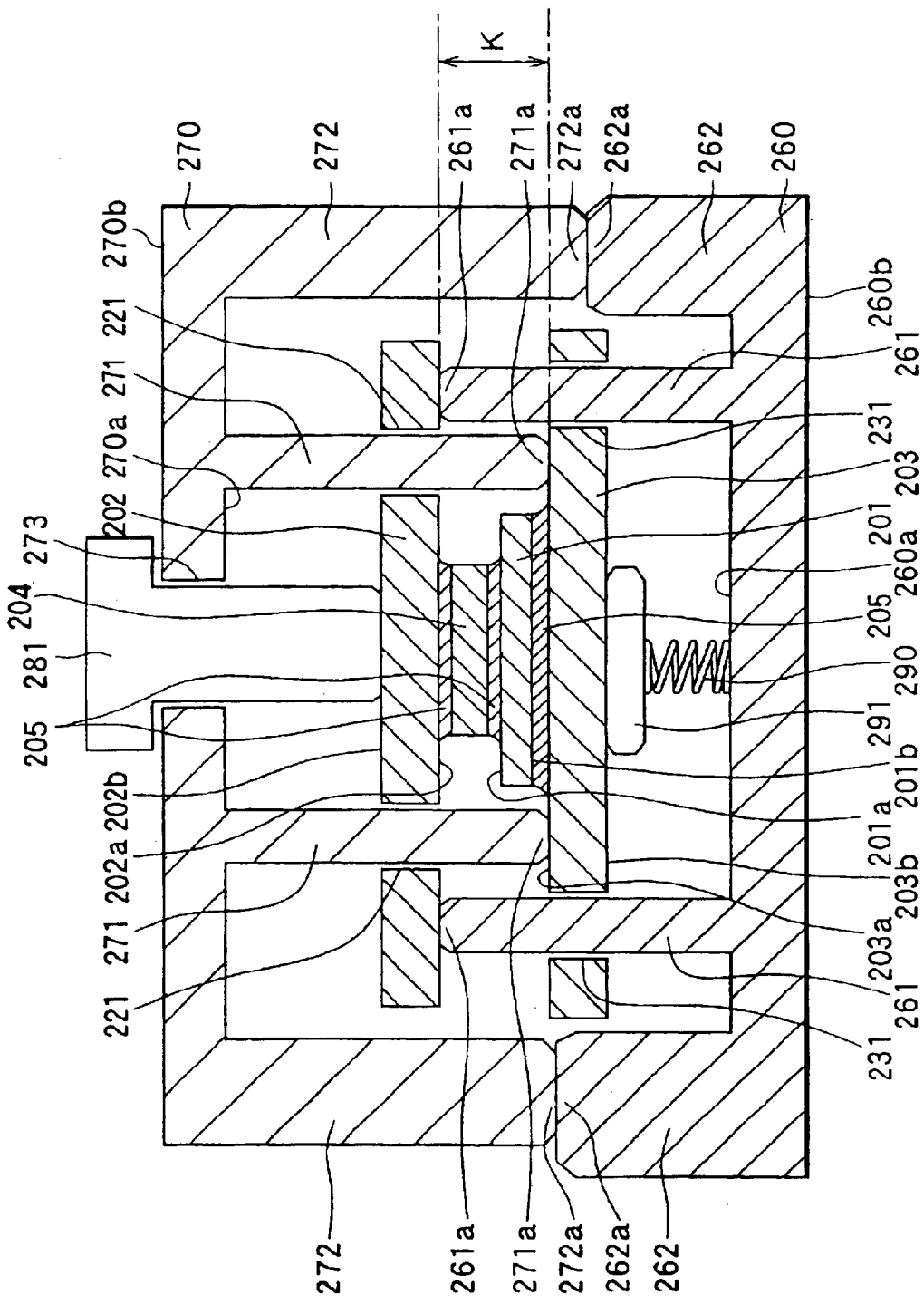
FIG. 18 is a cross-sectional view schematically showing another method for manufacturing the semiconductor device in the twelfth embodiment.

As shown in FIG. 18, dispensing with the weight 208, the second jig 270 may be formed with a through hole 273 extending in the thickness direction. In this case, after the laminated members are sandwiched by the first and second jigs 260, 270, a member 281 for pressurization can be inserted into the through hole 273 from the side of the surface 270b of the jig 270, and pressurize the surface 202b of the first side radiation member 202.

Here, another method for manufacturing the semiconductor device in this embodiment is explained. In the method described above, after the respective members 201 to 204 are laminated using solder paste, they are sandwiched by the first and second jigs 260, 270. However, after the laminated members 201 to 204 undergo reflow to be bonded by solder 205, the bonded members may be sandwiched by the first and second jigs 260, 270 and undergo the reflow again. At that time, the solder hardened is fused or softened to allow the members 201 to 204 to move, and the members 201 to 204 can be rearranged according to the dimensions determined by the jigs 260, 270. In this state, the solder 205 is hardened again.

Alternatively, the state shown in FIG. 17 can be provided by disposing the spring member 290, the base 291, the second side radiation member 203, a solder sheet, the semiconductor element 201, a solder sheet, the radiation block 204, a solder sheet, the first side radiation member 202, the weight 208, and the second jig 270, on the first jig 260 in this order, and by performing reflow to fuse and harden the solder sheets and to bond the members 201 to 204 together.

(Thirteenth Embodiment)

Hereinafter, a thirteenth preferred embodiment of the present invention is explained with reference to FIG. 19. Semiconductor chips used in this embodiment are a semiconductor chip in which an IGBT is formed (IGBT chip) 301 and a semiconductor chip in which a FWD (fly-wheel diode) is formed (FWD chip) 302. The semiconductor chips 301, 302 are made of mainly Si and have a thickness of about 0.5 mm. In the semiconductor chips 301, 302, element formation surfaces are referred to as main surfaces 301a, 302a, and the opposite surfaces are referred to as back surfaces 301b, 302b. An emitter electrode is formed on the main surface 301a of the IGBT chip 301 and a collector electrode is formed on the back surface 301b of the IGBT chip 301, though they are not shown.

To the main surfaces 301a, 302a of the semiconductor chips 301, 302, back surfaces 303b of heat sinks (E heat sinks) 303 as first conductive members are bonded through solder 304 as first bonding members having electrical conductivity. In the E heat sinks 303, a bonding area between the IGBT chip 301 and the E heat sink 303 is approximately the same as the area of the emitter electrode of the IGBT chip 301. Accordingly, the E heat sink 303 can contact the emitter electrode at the area as large as possible, and be prevented from contacting a peripheral portion of the emitter electrode.

On the main surface 301a of the IGBT chip 301, there exists a region such as a guard ring that might have a problem when it is made equipotential with the emitter electrode. If the heat sink 303 contacts this region, the region would have the same potential as that of the emitter electrode through the heat sink 303. Therefore, the contact area of the IGBT 301 and the E heat sink 303 is set to be approximately equal to the area of the emitter electrode of the IGBT chip 301. Accordingly, the E heat sink 303 can be bonded to the IGBT chip 301 without causing any problems.

To the back surfaces 301b, 302b of the semiconductor chips 301, 302, a main surface 305a of a second conductive member 305 is bonded (electrically connected) through solder 304 as second bonding members. To main surfaces 303a of the heat sinks 303 at an opposite side of the back surfaces 303b, a back surface 306b of a third conductive member 306 is bonded (electrically connected) through solder 304 as third bonding members.

The E heat sinks 303, and the second and third conductive members 305, 306 can be made of metallic members having electrical conductivity. In this embodiment, the E heat sinks 303 are made of Cu, and the second and third conductive members 305, 306 are made of Cu alloy. The second and third conductive members 305, 306 are plate-shaped members. The E heat sinks 303 also are plate-shaped members, but have step portions 303c as described below.

Each of the E heat sinks 303 is formed to protrude toward the third conductive member 306 by the step portion 303c, and has a thin portion 303d at the side of the semiconductor chips 301, 302. The thin portion 303d is thinned in the thickness direction of the semiconductor chip 301. Accordingly, in each of the E heat sinks 303, the bonding area between the E heat sink 303 and the third conductive member 6 is smaller than that between the E heat sink 303 and the semiconductor chip 301 or 302.

Besides, a surface treatment such as Ni plating is performed to the surface portions of the E heat sinks 303 where it is bonded to the respective semiconductor chips 301, 302 and the third conductive members 306 to improve wettability of the solder 304. The other outer surfaces of the E heat sinks 303 for contacting a sealing member described below are oxidized. The second and third conductive members 305, 306 are plated with Ni at entire outer surfaces thereof. In the second and third conductive members 305, 306 and the E heat sinks 303, the thickness of the thickest portion is about 1 mm, and the thickness of the thin portion is about 0.4 mm.

A land (not shown) is formed on the main surface of the IGBT chip 301, and is electrically connected to a control terminal 307 of a lead frame via a bonding wire 308. Then, the semiconductor chips 301, 302, the E heat sinks 303, the main surface 305a of the second conductive member 305, the back surface 306b of the third conductive member 306, and a part of the control terminal 307 are integrally sealed with resin 309 as a sealing member. Used as the resin 309 is, for example, epoxy based mold resin. Accordingly, a the members 301 to 308 are integrally sealed to have the back surface 305b of the second conductive member 305, the main surface 306a of the third conductive member 306, and a part of the control terminal 307 that are exposed from the resin 9.

Thus, the semiconductor device in this embodiment is constructed. In this semiconductor device, heat generated from the semiconductor chips 301, 302 is transferred to the E heat sinks 303, and to the second and third conductive members 305, 306 through the solder 304, and then is radiated from the back surface 305b of the second conductive member 305 and the main surface 306a of the third conductive member 306.

When cooling members or the like are disposed to abut the back surface 305b of the second conductive member 305 and the main surface 306a of the third conductive member 306, heat radiation can be further facilitated. Here, the E heat sinks 303 and the second and third conductive members 305, 306 form electrical paths for the respective semiconductor chips 301, 302. That is, the electrical communication with the collector electrode of the IGBT chip 301 is provided through the second conductive member 305, while the electrical communication with the emitter electrode of the IGBT chip 301 is provided through the second conductive member 306 and the E heat sink 303.

As explained above, in the present embodiment, each of the E heat sinks 303 bonded to the surfaces 301a, 302a of the semiconductor chips 301, 302 has the step portion 303c and accordingly has the thin portion 303d. Because the thin portion 303d has small rigidity, the thin portion 303d can follow deformation of the resin 309 surrounding it and can absorb thermal stress when the semiconductor device undergoes thermal cycle. Therefore, stress concentration on the solder 304 bonding the semiconductor chips 301, 302, and the E heat sinks 303 can be mitigated.

In general, the smaller the bonding area of solder is, the smaller the bonding strength of the solder becomes. Therefore, in each of the E heat sinks 303, the bonding area with the third conductive member 306 is set to be smaller than that with the semiconductor chip 301 or 302. Accordingly, cracks become liable to be produced in the solder 304 bonding the E heat sink 303 and the third conductive member 306.

As a result, when thermal stress is increased, cracks are produced first in the solder 304 bonding the E heat sink 303 and the third conductive member 306 to mitigate thermal stress, and accordingly thermal stress applied to the solder 304 bonding the E heat sink 303 and the semiconductor chip 301 or 302 can be lessened.

Incidentally, even when cracks are produced in the solder 304 bonding the E heat sink 303 and the third conductive member 306 as a result of stress concentration, because both the E heat sink 303 and the third conductive member 306 include Cu as a main component, those deformations caused by the thermal cycle are approximated to each other and cracks do not advance largely in the solder 304. Even if the cracks advance, because the current path is formed by the entire bonding surface between the E heat sink 303 and the third conductive member 306, significant problems do not occur.

Further, because the surface portions of the E-heat sink 303 for contacting the resin 309 are oxidized, adhesion with the resin 309 can be improved. As a result, the deformation of the resin 309 caused by thermal stress and the deformation of the E heat sink 303 synchronize with each other, and stress concentration on the solder 304 bonding the E heat sink 303 and the semiconductor chip 301 or 302 can be mitigated. Incidentally, adhesion between Cu alloy and the resin 309 is improved by plating the Cu alloy with Ni. Therefore, the surfaces of the second and third conductive members 305, 306 are plated with Ni instead of oxidation.

Thus, thermal stress concentration to the solder 304 bonding the respective semiconductor chips 301, 302 and the E heat sinks 303 can be suppressed, so that cracks can be prevented to reach this solder 304. Even when several cells are formed on the main surface (element formation surface) 301a of the IGBT chip 301, current is prevented from concentrating on a cell provided at the center, and breakage of the cell is prevented.

Also, because each of the E heat sinks 303 has the step portion 303c, as compared with a case of adopting a prism shape heat sink without a step portion, a creepage distance from the interface between the third conductive member 306 and the resin 309 to the bonding portion between the semiconductor chip 301 or 302 and the E heat sink 303 is long. Because of this, it can be retarded that cracks produced at the interface between the third conductive member 306 and the resin 309 reach the bonding portion between the semiconductor chip and the E heat sink 303.

With respect to the semiconductor device according to this embodiment, a thermal shock cycle test was performed, in which the semiconductor device was exposed to environments of −40° C. and 125° C. respectively for 60 minutes, a resistance between the third conductive member 306 and the control terminal 307 was measured, and a rate of change in resistance was calculated using an initial value as a reference. Then, it was confirmed that the rate of change in resistance did not increase largely even at 200 cycles. It was further confirmed that the rate in change of resistance of the semiconductor device in this embodiment was small as compared to a case where the heat sink had no step portion.

Next, a method for manufacturing the semiconductor device in this embodiment is explained with reference to FIGS. 20A to 20C. First, the second and third conductive members 305, 306 are formed from plates made of cupper alloy or the like by punching. After that, the entire outer surfaces of the second and third conductive members 305, 306 are plated with Ni.

Cu plates are prepared for forming the E heat sinks 303. Ni plating is performed to both the main and back surfaces of each Cu plate. After that, Cu members having a size corresponding to the E heat sinks 303 are formed from the Cu plates plated with Ni, by punching or the like. Then, each of the Cu members is pressed to have the step portion 303c. Thus, the E heat sinks 303 are completed. Each of the E heat sinks 303 has portions plated with Ni for being bonded to the semiconductor chip 301 or 302 and to the third conductive member 306, and portions exposed by punching and not plated with Ni. At the exposed portions, plating is peeled off by pressing.

Figure 20A:
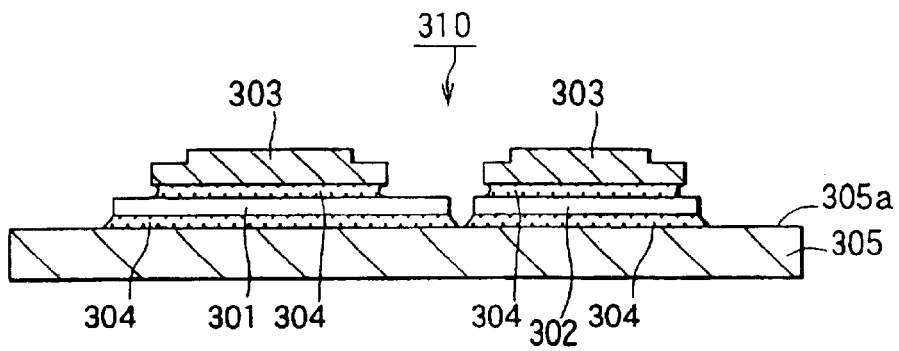
FIGS. 20A to 20C are cross-sectional views for explaining a method for manufacturing the semiconductor device shown in FIG. 19.

As shown in FIG. 20A, the semiconductor chips 301, 302 are bonded to the main surface 305a of the second conductive member 305 through the solder 304. Next, the E heat sinks 303 are bonded to the respective semiconductor chips 301, 302 through the solder 304. The solder 304 used for bonding the semiconductor chips 301, 302 and the second conductive member 305, and the E heat sinks 303 has a relatively high fusing point. For example, solder composed of 10 wt % Sn (tin) and 90 wt % Pb (lead) and having a fusing point of 320° C. (high temperature solder) can be used as the solder 304. Accordingly, the state shown in FIG. 20A is provided, which is referred to as a work 310.

Figure 20B:
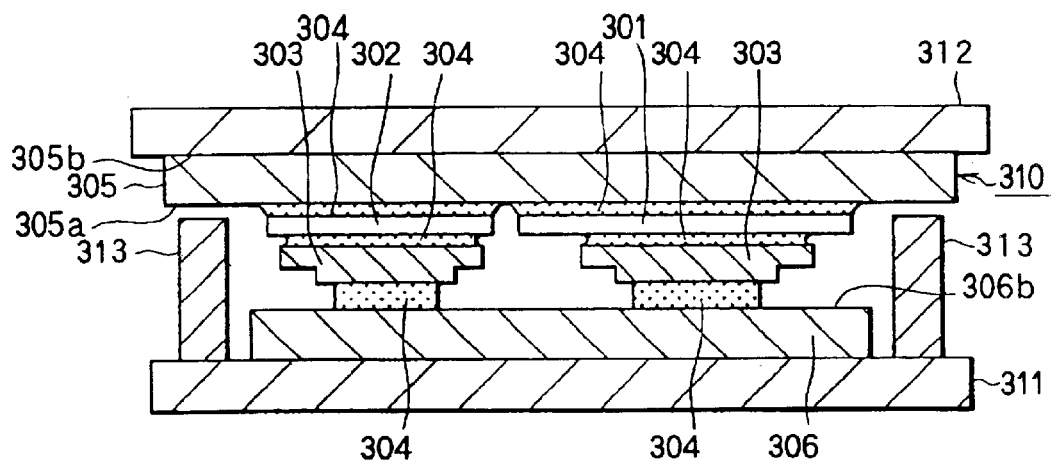
Figure 20C:
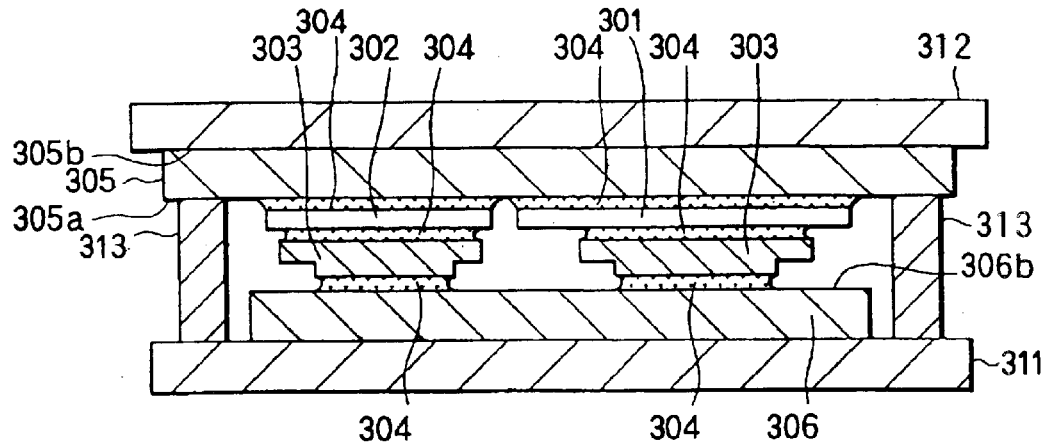

Next, as shown in FIG. 20B, the third conductive member 306 is put on a jig 311 with the back surface 306b facing upward, and solder 4 is disposed on desirable regions of the back surface 306b. Then, the work 310 shown in FIG. 20A is turned over, and is disposed on the third conductive member 306. The solder 4 interposed between the third conductive member 306 and the semiconductor chips 301, 302 has a fusing point lower than that of the high temperature solder described above. For example, solder containing Sn at 90 wt % or more and having a fusing point of 240° C. can be used as the solder 4. Hereinafter, this solder is referred to as low temperature solder.

Further, a plate-shaped weight 312 is disposed on the back surface 305b of the second conductive member 305. Here, the jig 311 has a spacer 313 having a predetermined height for fixing the distance between the second and third conductive members 305, 306. This state is shown in FIG. 20C. In this state, it is put into a heating furnace, and reflow is performed only to the low temperature solder 4. As a result, the work 310 is pressurized by the weight 312, and as shown in FIG. 20C, the low temperature solder 4 is crushed so that the distance between the back surface 306b of the third conductive member 306 and the main surface 305a of the second conductive member 305 corresponds to the height of the spacer 313. Accordingly, the degree of parallelization between the second and third conductive members 305, 306 can be adjusted.

Also, the E heat sinks 303 are bonded to the respective semiconductor chips 301, 302 in the state where the E heat sink 303 contacts only the emitter electrode on the IGBT chip 301 by the high temperature solder 304, and are bonded to the third conductive member 306 by the low temperature solder 304. Therefore, when the heat sinks 303 are bonded to the third conductive member 306, the high temperature solder 304 does not fuse, and the bonding positions of the E heat sinks 303 to the semiconductor chips 301, 302 can be appropriately maintained. Incidentally, when the fusing points of the high temperature solder 304 and the low temperature solder 304 are respectively 320° C. and 240° C., the reflow temperature for the low temperature solder 304 is preferably 250° C.

Figure 19:
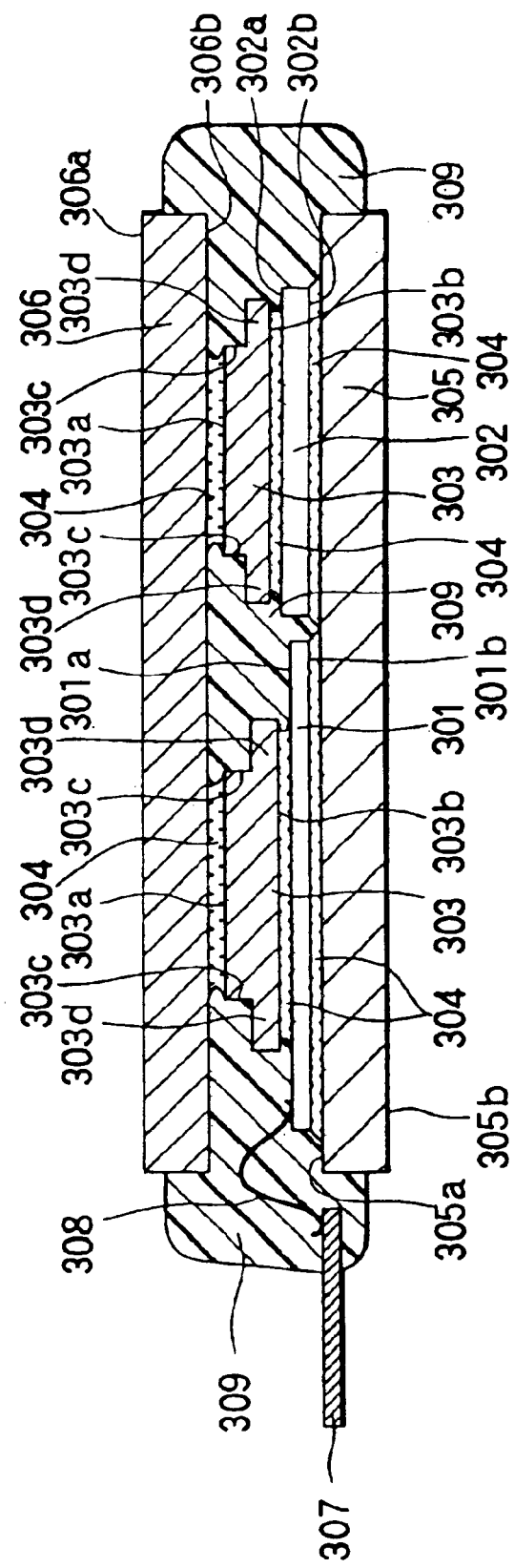
FIG. 19 is a cross-sectional view showing a semiconductor device in a thirteenth preferred embodiment.

After that, although it is not shown, the control terminal 307 and the IGBT chip 301 are electrically connected to each other by the bonding wire 308, and the members 301 to 308 are sealed with resin 309 as shown in FIG. 19. This resin sealing is performed by injecting the resin 309 having a temperature of about 180° C. into spaces provided among the members 301 to 308. At that time, the surface portions of the E heat sinks 303 exposing copper and not bonded to either of the semiconductor chips 301, 302 and the third conductive member 306 are oxidized. Thus, the semiconductor device is completed.

In general, when Ni plating is performed to the E heat sink, after the E heat sink is formed into the shape capable of being disposed between the semiconductor chip and the third conductive member, the E heat sink is put in a plating machine, and an entire area of the outer surface of the E heat sink is plated. Therefore, the solder disposed on the E heat sink can easily wet and expand to the region other than the bonding portions with the semiconductor chip and the third conductive member.

In addition, the thickness of the E heat sink 303 is thin, i.e., about 1 mm, the low temperature solder 304 and the high temperature solder 304 are located at close positions to each other. If the Ni plating is performed to the entire outer surface of the E heat sink 303, there arises a case where the low temperature solder 304 and the high temperature solder 305 are mixed with each other. As a result, eutectic solder having a fusing point much lower than that of the low temperature solder 304 might be formed, which can fuse at the temperature (for example, 180° C.) for sealing the members 301 to 308 with the resin 309.

As opposed to this, in the present embodiment, Ni plating is performed only to the portions of the E heat sink 303 for bonding the semiconductor chip 301 or 302 and the third conductive member 306. The low temperature solder 304 and the high temperature solder 304 are disposed with the oxide surface of Cu interposed therebetween. Because the wettability of the oxide surface of Cu to the solder 304 is low, the high temperature solder 304 and the low temperature solder 304 do not expand to other regions than the bonding portions, and do not mix with each other. Incidentally, although solder is used as the bonding members (first to third bonding members) in this embodiment, Ag paste or the like can be used alternatively. The bonding members need not be always an identical material with one another.

(Fourteenth Embodiment)

FIG. 21 shows a semiconductor device in a fourteenth preferred embodiment. The fourteenth embodiment differs from the thirteenth embodiment in the shape of the third conductive member 306. Hereinafter, different portions from the thirteenth embodiment are mainly explained. In FIG. 21, the same parts as those in FIG. 19 are assigned to the same reference numerals, and the same explanations are not reiterated.

As shown in FIG. 21, a step portion 306c is formed on the main surface 306a of the third conductive member 306. Then, the step portion 306c is covered with the resin 309 for sealing. Accordingly, creepage distances from the interface between the resin 309 and the third conductive member 306 to the bonding portions of the E heat sinks 303 with the semiconductor chips 301, 302 on the surface of the semiconductor device can be further increased as compared to those in the first embodiment. As a result, cracks are further suppressed from being produced in the solder 4 bonding the semiconductor chips 301, 302 and the E heat sinks 303.

Incidentally, the creepage distances can be further increased as the area covered with the resin 309 on the surface 306a of the third conductive member 306 is increased. However, the decreased exposed area of the third conductive member 306 deteriorates the radiation property. Therefore, the third conductive member 306 should be covered with the resin 309 at a degree not to deteriorate the radiation property.

(Fifteenth Embodiment)

FIG. 22 shows a semiconductor device in a fifteenth preferred embodiment. This embodiment differs from the thirteenth embodiment in a point that conductive members are disposed between the respective semiconductor chips 301, 302 and the second conductive member 305. Hereinafter, portions different from the thirteenth embodiment are mainly described. In FIG. 22, the same parts as those in FIG. 19 are assigned to the same reference numerals.

As shown in FIG. 22, collector heat sinks (C heat sinks) 314 are disposed between the second conductive member 305 and the respective semiconductor chips 301, 302, at the side of the back surfaces 301b, 302b of the semiconductor chips 301, 302. The C heat sinks 314 has areas approximately the same as those of the corresponding semiconductor chips 301, 302 in a direction perpendicular to the thickness direction of the semiconductor chips 301, 302.

Specifically, surfaces (main surfaces) 314a of the C heat sinks 314 are respectively bonded to the back surfaces 301b, 302b of the semiconductor chips 301, 302 through the solder 304. Back surfaces 314b of the C heat sinks 314 are bonded to the main surface 305a of the second conductive members 305 through the solder 304.

The second conductive member 305 has a relatively large area with respect to its thickness, and therefore has a possibility that it is bent (warped). On the other hand, when the injection of the resin 309 is performed, the back surface 305b of the second conductive member 305 and the main surface 306a of the third conductive member 306 are pinched under relatively large pressure to prevent leakage of the resin 309. Therefore, if the second conductive member 305 holding the semiconductor chips 301, 302 is bent, the pressure pinching the second and third conductive members 305, 306 during the sealing can mechanically cause damages to the semiconductor chips 301, 302.

As opposed to this, in this embodiment, the C heat sinks 314 are disposed on the back surfaces 301b, 302b of the semiconductor chips 301, 302, and the C heat sinks 314 are smaller than the second conductive member 305 in size. Therefore, the bending can be suppressed and the semiconductor chips 301, 302 can be securely prevented from being damaged. Thus, this embodiment can prevent the mechanical damage to the semiconductor chips 301, 302, in addition to the effects as attained in the thirteenth embodiment. Incidentally, in the constitution described in the fourteenth embodiment in which the third conductive member 306 has the step portion 306c that is covered with the resin 309, the C heat sinks 314 can be disposed as well.

In the thirteenth to fifteenth embodiments described above, the E heat sinks 303 respectively have the thin portions 303d at the side of the semiconductor chips 301, 302; however, as shown in FIG. 23, the step portions 303d may be provided at the side of the third conductive member 306. Also in this constitution, thermal stress can be prevented from concentrating on the solder 4 at the bonding portions between the semiconductor chips 301, 302 and the heat sinks 303 by the low rigidity thin portions 303d that can absorb the thermal stress, as compared to the case where the E heat sinks have a prism-like shape.

In the thirteenth to fifteenth embodiments described above, in each of the E heat sinks 303, the step portion 303c is provided at an entire portion contacting the resin 309; however, with respect to the solder 304 bonding the semiconductor chips 301, 302 and the E heat sinks 303, cracks progress from the periphery side of the resin 309 toward the center. Therefore, the step portion 303c may be provided only at the portion facing the outer periphery of the resin 309. Here, the periphery of the resin 309 means a periphery of a portion surrounding the second and third conductive members 305, 306, and in FIG. 19 it corresponds a surface approximately parallel to the thickness direction of the semiconductor chips 301, 302.

(Sixteenth Embodiment)

FIG. 24 shows a semiconductor device in a sixteenth preferred embodiment. In this embodiment, an IGBT 411 and a FWD (free-wheel diode) 412 each of which is made of a Si substrate are used as semiconductor chips. At a side of each element formation surface (first surface) 401a of the IGBT 411 and the FWD 412, first side and second side radiation members 421, 422 are bonded through solder 431. A third radiation member 423 is further bonded to the first side and second side radiation members 421, 422 through solder 432 at an opposite side of the chips 411, 412. The first to third radiation members 421 to 423 are made of, for example, Cu and constitute a first side radiation member 420.

The third radiation member 423 is a plate having a protruding portion 423b., and has a generally L-shape cross-section with the protruding portion 423b as a short side in a thickness direction thereof. The first side and second side radiation members 421, 422 are bonded to a long side of the L-shape of the third radiation member 423. The protruding portion 423b has a front end portion 423a tat is approximately coplanar with second surfaces 401b of the chips 411, 412 at an opposite side of the first surfaces 401a.

Besides, a DBC (Direct Bonding Cupper) substrate 404 is disposed as a high thermal conductivity insulating substrate at a side of the second surfaces 401b of the chips 411, 412. The DBC substrate 404 is composed of an AlN (aluminum nitride) substrate 405 both first and second surfaces 405a, 405b of which are patterned with copper foils 451 to 454. The second surfaces 401b of the chips 411, 412 are respectively bonded to a first copper foil 451 on the first surface 405a of the DBC substrate 404, through solder 433. Further, the front end portion 423a of the protruding portion 423b of the third radiation member 423 is bonded to the second copper foil 452 of the DBC substrate 404, through solder 434.

Figure 25:
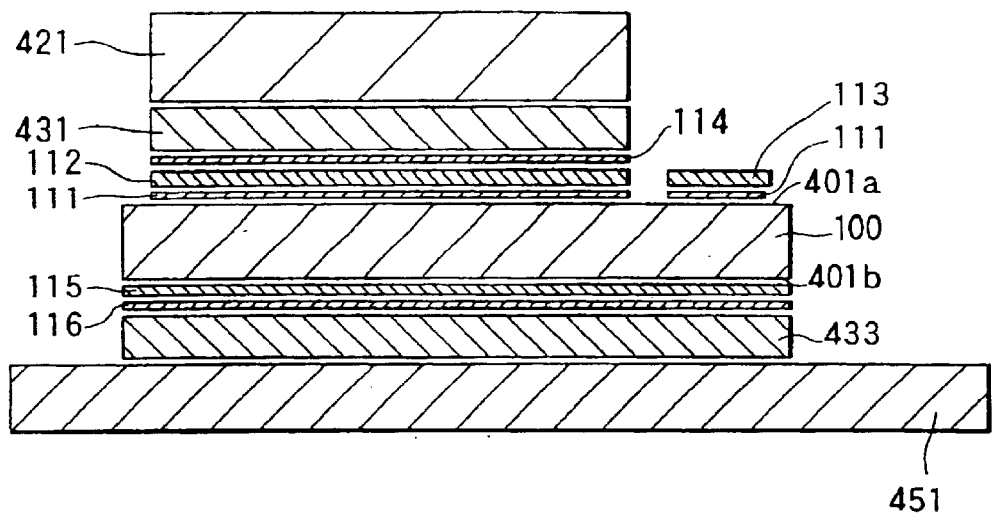
FIG. 25 is an enlarged cross-sectional view showing a part surrounded by a broken line in FIG. 24.

Next, the electrode (wiring) portion of the IGBT 411 is explained with reference to FIG. 25 showing a part surrounded by a broken line in FIG. 24. As shown in FIG. 25, a barrier metal 111 is formed on a substrate 100 of the IGBT 411 at the side of the first surface 401a. An emitter electrode 112 and a land 113 for wire bonding are further formed from pure Al. The barrier metal 111 is composed of Ti (titanium) and TiN (titanium nitride) which are formed on the substrate 100 at this order, and has a thickness of about 0.1 $\mu$m. The thickness of the electrode 112, 113 is about 5 $\mu$m.

Further, a metallic film 114 is formed on the emitter electrode 112 to be suitably connected with the solder 431. The metallic film 114 is composed of Ti, Ni (nickel), and Au (gold) formed from the side of the emitter electrode 112 sequentially, and has a total thickness of about 0.6 $\mu$m. To this metallic film 114, as described above, the first side radiation member 421 is bonded through the solder 431. Here, the thicknesses of the solder 431 and the first side radiation member 421 are, for example, about 0.1 mm and about 1.5 mm respectively.

On the other hand, at the side of the second surface 401b of the substrate 100, a collector electrode 115 made of pure Al is formed without barrier metal. The collector electrode 115 is, for example, about 0.2 $\mu$m in thickness. A metallic film 116 is then formed on the collector electrode 115, similarly to the emitter electrode 112. The metallic film 116 is bonded to the first cupper foil 451 on the first surface 405a of the DBC substrate 404 through the solder 433. Incidentally, the electrode portion of the FWD 412 has a structure substantially the same as that of the IGBT 411.

Further, as shown in FIGS. 24 and 25, the third radiation member 423 is electrically connected to a lead 461 by a connection terminal 406a for electrically connecting the emitter electrode 112 and the lead (emitter terminal) 461 as an outside terminal. On the DBC substrate 404, a land 453 is formed, and is wire-bonded to the land 113 on the surface 401a of the IGBT 411 by a wire 407. The land 453 of the DBC substrate 404 is further wire-bonded to a gate terminal 408 by another wire 407. As the wires 407, Au, Al, or the like used generally for wire bonding can be used. The land 453 of the DBC substrate 404 is provided for an intermediation between the land 113 and the gate terminal 308.

To the copper foil 454 formed on the back surface 405b of the DBC substrate 404, a fourth radiation member (second side radiation member) 424 is bonded through solder 435. That is, the first side radiation member 420 and the second side radiation member 424 are joined together with the DBC substrate 404 interposed therebetween, and electrical insulation and electrical conductivity of the respective radiation members 420, 424 can be secured respectively.

Then, the members described above are sealed with resin 400 so that the fourth radiation member 424 has a radiation surface 409 exposed at an opposite side of the surface bonding the DBC substrate 404. For example, epoxy based mold resin can be used as the resin 400.

Figure 26:
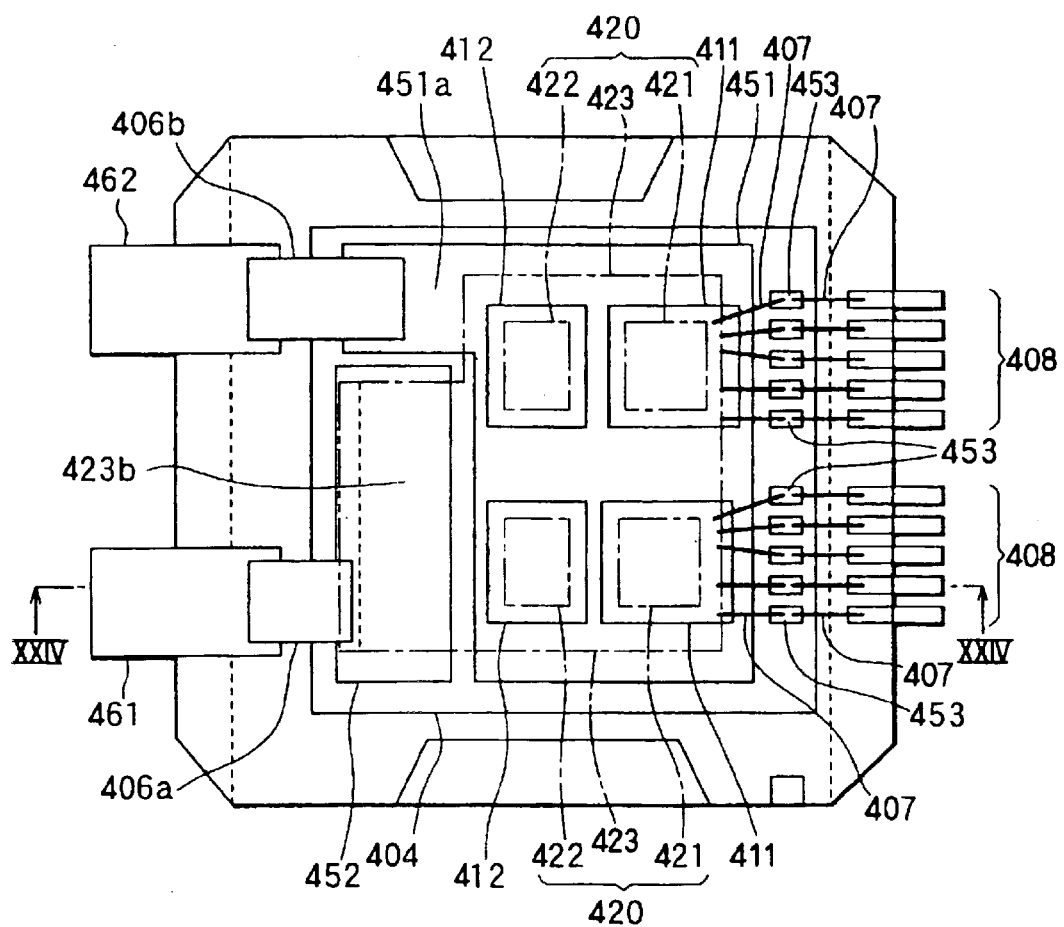
FIG. 26 is a top plan view showing the semiconductor device in a direction indicated by arrow XXVI in FIG. 24.

Next, the electrical connection in each part of the semiconductor device in this embodiment is explained in more detail, referring to FIG. 26 that shows the semiconductor device in a direction indicated by arrow XXVI in FIG. 24. Incidentally, FIG. 24 shows a cross-section taken along line XXIV—XXIV in FIG. 26. The semiconductor device holds two pairs of the IGBT 411 and the FWD 412 in this embodiment.

The first side radiation member 420 (421 to 423) is indicated with a one-dot chain line in the figure, and as described above, is electrically connected with the emitter terminal 461 through the connection terminal 406a. The first copper foil 451 of the DBC substrate 404 is bonded to all of the electrodes on the surfaces 401b of the IGBTs 411 and the FWDs 412, and has a protruding portion 451a protruding not to contact the second cupper foil 452 of the DBC substrate 404. The protruding portion 451a is electrically connected to the collector terminal 462 as a lead through a connection terminal 406b.

In this semiconductor device, the radiation surface 409 is fixed to a radiation fin (not shown) as a cooling member (outside radiator) by screwing or the like. Accordingly, heat generated from the first surfaces 401a of the chips 411, 412 is radiated from the radiation surface 409 through the first side radiation member 420, the DBC substrate 404, and the second side radiation member 424. That is, the radiation direction from the first surfaces 401a of the chips 411, 412 corresponds to the direction extending from the first surfaces 401a to the second surfaces 401b in the respective chips 411, 412 (from the upper side to the lower side in FIG. 24).

On the other hand, heat generated from the second surfaces 401b of the chips 411, 412 is also radiated from the radiation surface 409 through the DBC substrate 404 and the second side radiation member 424. Thus, in the semiconductor device in which the chips are mounted, radiation of heat from both the surfaces 401a, 401b of the chips 411, 412 is performed mainly by the same radiation surface 409.

Next, a method for manufacturing the semiconductor device in this embodiment is explained. First, as describe above, the IGBT 411 having the barrier metal 111, the emitter electrode 112, the collector electrode 115, the metallic films 114, 116, and the like and the FWD 412 are prepared. The electrodes 112, 115, the barrier metal 111, the metallic films 114, 116, and the like are formed by sputtering or the like. Then, the first side and second side radiation members 421, 422 are soldered to the first surfaces 401a of the chips 411, 412.

Next, the DBC substrate 404 having the first and second surfaces 405a, 405b on which the cupper foils 451 to 454 are patterned is prepared, and the IGBT 411 and the FWD 412 are soldered to predetermined portions of the DBC substrate 404. After that, the third radiation member 423 is soldered not only to the first side and second side radiation members 421, 422 but also to the DBC substrate 404. When soldering the third radiation members 423, a thickness of solder is thickened at the bonding portion with the DBC substrate 404 as compared to that with the first side and second side radiation members 421, 422, and accordingly, variations in thickness by soldering is absorbed.

These soldering can be performed by reflow or the like. When kinds of solder used in this method are changed so that fusing points of solders are decreased in the order of the soldering, the soldering can be sufficiently performed without affecting the solder that has been soldered first. Then, the emitter terminal 461 and the collector terminal 462 are connected to the third radiation member 423, and the IGBT 411 and the gate terminal 408 are wire-bonded to each other. Successively, the fourth radiation member 424 is soldered to the DBC substrate 404, and finally resin sealing is performed.

According to the present embodiment, because an elastic modulus of pure Al is small, thermal stress produced due to differences among the chips 411, 412 and the radiation members 421 to 424 can be mitigated. Specifically, the elastic modulus of pure Al is 72 GPa, and an elastic modulus of Al containing Si at 1% is about 75 GPa. When the Al containing Si is used, Si may be segregated. In such a case, because the elastic modulus of Si is 130 GPa, the capability for mitigating thermal stress is locally but significantly decreased.

As opposed to this, in this embodiment, especially because the emitter electrode 112 of the IGBT 411 is made of pure Al, stress is prevented from concentrating on the emitter cell, and fluctuation in electrical characteristics such as Vt can be suppressed. Therefore, the chip and the semiconductor device can be provided with high electrical reliability. Also, because the electrodes on the second surfaces 401b of the chips 411, 412 are made of pure Al, the chips 411, 412 are prevented from being warped due to thermal stress.

Also, because Si is not contained in the electrodes 112, 113, 115, deposition of Si nodule can be prevented. This is especially effective for the land 113 for wire bonding because Si nodule can cause cracks in the device by vibrations (stress) produced by wire-bonding. Thus, externally applied stress can be mitigated by forming the electrodes 112, 113, 115 from pure Al.

However, when the pure Al is brought in direct contact with the substrate 100 made of Si, ally spikes are produced. Therefore, the barrier metal 111 is disposed between the electrodes 112, 113 and the substrate 100, and prevents the generation of alloy spikes. Incidentally, the barrier metal is not formed on the other surface 401b of the IGBT 411. This is because even when alloy spikes are produced on the other surface 401b, the alloy spikes do not reach the device formed at the side of the surface 401a.

In the semiconductor device in which a chip is sandwiched by a pair of radiation members respectively having radiation surfaces, cooling members sandwich the semiconductor device to contact the radiation surfaces respectively. However, in this constitution, stress produced when the cooling members sandwiche the semiconductor device is liable to be concentrate on the chip.

As opposed to this, in this embodiment, the radiation surface 409 for radiating heat to the outside of the semiconductor device is formed at one side (the side of the second surfaces 401b) of the chips 411, 412. In this constitution, the semiconductor device needs not be sandwiched by the cooling members for radiating heat. Therefore, even when the radiation surface 409 is firmly bonded to the outside cooling member, large stress is not applied to the chips 411, 412.

Especially, because the radiation surface 409 is provided at the side of the second surfaces 401b of the chips 411, 412, stress is prevented from concentrating on the first surfaces 401a of the chips 411, 412, and the fluctuations in electric characteristics of the device provided at the first surface side can be securely prevented.

Further, because both surfaces 401a, 401b of the chips 411, 412 are bonded to the radiation members 421, 422, 424, respectively, the radiation of heat is performed from both surfaces 401a, 401b of the chips 411, 412. Therefore, the radiation property is also sufficient.

Furthermore, the radiation surface 409 is electrically insulated from the chips 411, 412 by the DBC substrate 404 that is an insulating substrate disposed inside the semiconductor device. Therefore, there is no need to consider electrical insulation when the radiation surface 409 is bonded to the outside cooling member. Also, the one insulating substrate 404 can secure electrical insulation from both the first and second surfaces 401a, 401b of the chips.

In this embodiment, although the radiation surface 409 is provided at the side of the second surfaces 401b of the chips 411, 412, the other portion can assist the radiation of heat. For example, the third radiation member 423 may be partially exposed from the resin 400 to assist the radiation of heat. The electrode 115 formed on the second surfaces 401b of the chips 411, 412 needs not be made of pure Al to protect the devices of the chips 411, 412. The first to third radiation members 421 to 423 are separate members, and are integrally bonded to form the first side radiation member 420 by soldering in this embodiment; however, they may be formed as an integrated member.

The electrodes for the FWD 412 need not be formed from pure Al if no problem occurs concerning thermal stress or the like. When the first side radiation member 420 needs not be electrically insulated from the second side radiation member 424, the DBC substrate 404 made of AlN can be omitted. The DBC substrate 404 can dispense with the land 453 if the land 113 of the IGBT 411 can be wire-bonded to the gate terminal 408 directly.

(Seventeenth Embodiment)

Figure 27:
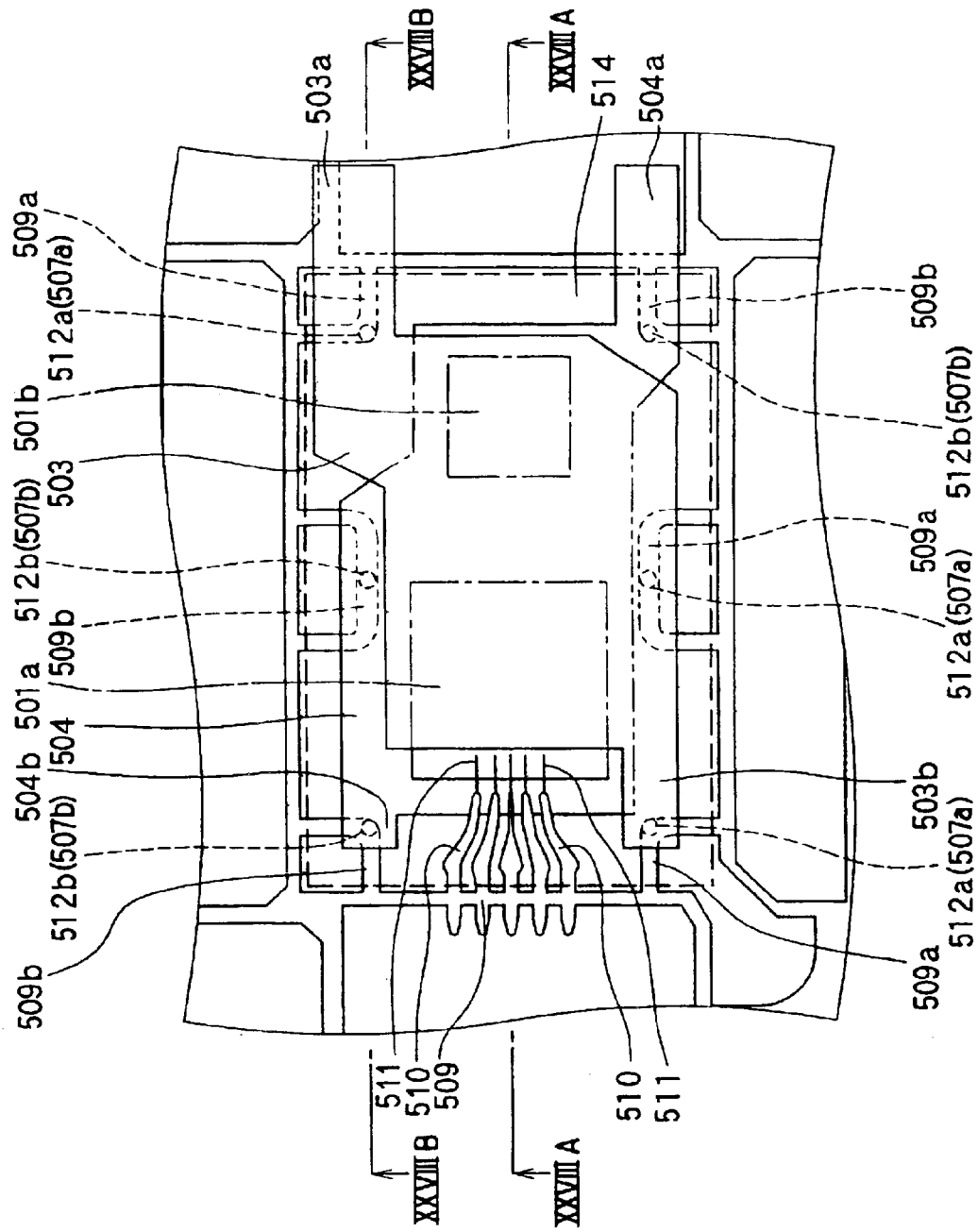
FIG. 27 is a top plan view showing a semiconductor device in a seventeenth preferred embodiment.
Figure 28A:
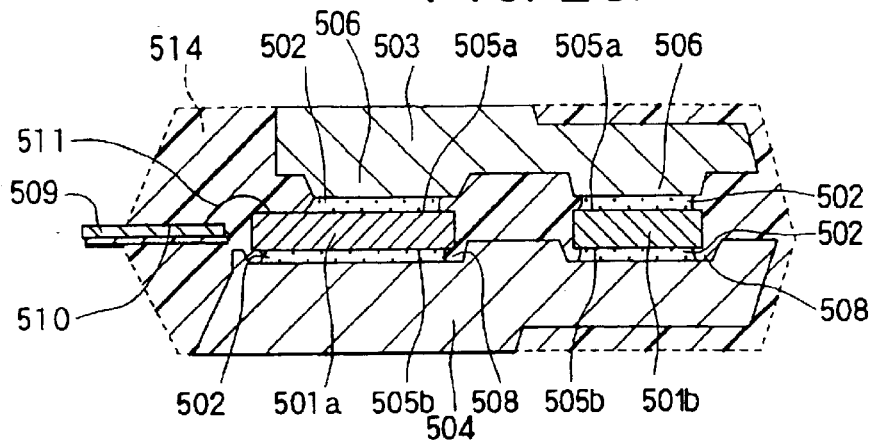
FIG. 28A is a cross-sectional view showing the semiconductor device, taken along line XXVIIIA—XXVIIIA in FIG. 27.
Figure 28B:
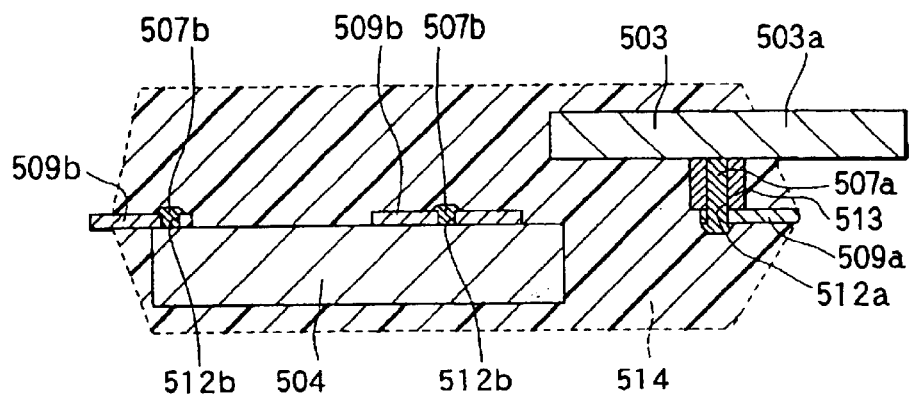
FIG. 28B is a cross-sectional view showing the semiconductor device, taken along line XXVIIIB—XXVIIIB in FIG. 27.

A semiconductor device in a seventeenth preferred embodiment is shown in FIGS. 27, 28A and 28B. As shown in the figures, in this embodiment, first side and second side radiation members 503, 504 are bonded to two Si chips 501a, 501b, which are arranged on a plane, through a bonding member 502 having thermal conductivity to sandwich the chips 501a, 501b.

The first side radiation member 503 is boned to surfaces (first surfaces) 505a of the Si chips 501a, 501b to which wire bonding is performed, and the second side radiation member 504 is bonded to the other surfaces (second surfaces) 505b of the Si chips 501a, 501b at an opposite side of the surfaces 505a. In FIG. 27, portions of the second side radiation member 504 where it overlaps with other members are indicated with two-dot chain lines, and portions of the Si chips 501a, 501b where they overlap with other members are indicated with one-doe chain lines.

In this embodiment, the Si chip wire-bonded in FIG. 27 is an IGBT chip 501a, and the other Si chip is a fly-wheel diode chip 501b. In the IGBT chip 501a, the first side radiation member 503 serves as an emitter terminal, and the second side radiation member 504 serves as a collector terminal. On the surface of the IGBT chip 501a facing the first side radiation member 503, a control electrode (not shown) for giving or receiving electrical signals to or from an external is formed, and is wire-bonded to an inner lead 510.

Figure 29:
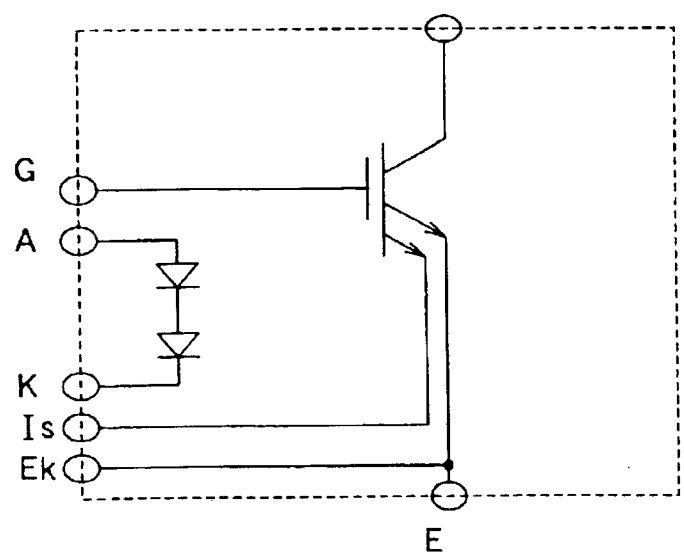
FIG. 29 is a diagram showing an equivalent circuit of an IGBT chip in the semiconductor device in the seventeenth embodiment.

An equivalent circuit of the IGBT chip 501a is, for example as shown in FIG. 29, which is composed of a collector C, an emitter E, a gate G, a current detection terminal Is, an anode A that is a diode terminal for thermosensitivity, and a cathode K.

As shown in FIGS. 27, 28A, and 28B, the plane shape of the first side radiation member 503 is substantially a rectangle and has strip portions 503a, 503b respectively extending from opposite corners of the rectangle in opposite directions to each other. Besides, the first side radiation member 503 has convex portions (protruding portion) 506 respectively protruding in a thickness direction thereof to face principal electrodes of the Si chips 501a, 501b at the side of the surfaces 505a. Front ends of the convex portions 506 are flat at a level that does not interfere with bonding with the Si chips 501a, 501b, and the shapes of the flat front ends correspond to plane shapes of the principal electrodes of the Si chips 501a, 501b.

Besides, on the surface of the first side radiation member 503 facing the Si chips 501a, 501b, protruding portions 507a are provided at three locations that are at the strip portions 503a, 503b and at an inside of one side parallel to the directions in which the strip portions 503a, 503b extend. The protruding portions 507a protrude toward the side of the Si chips 501a, 501b.

The second side radiation member 504 is approximately the same as the first side radiation member 503, but has two strip portions 504a that are provided at different locations from those of the strip portions 503a of the first side radiation member 503. In the thickness direction, concave portions 508 are provided to fitly accommodate the Si chips 501a, 501b. The depths of the concave portions 508 are about 0.1 to 0.3 mm.

Further, the surface of the second side radiation member 504 facing the Si chips 501a, 501b has protruding portions 507b protruding toward the side of the Si chips 501a, 501b at three locations that are at the strip portions 504a, 504b, and at an inside of one side parallel to the directions in which the strip portions 504a, 504b extend. The protruding portions 507b of the second side radiation member 504 are positioned not to overlap with the protruding portions 507a of the first side radiation member 503 when they are observed in an upper direction as shown in FIG. 27.

The first side and second side radiation members 503, 504 are, for example, made of Cu (copper). The bonding members 502 are made of material having high thermal conductivity, such as solder, or brazing filler metal. Then, the surfaces 505b of the Si chips 501a, 501b are fit in the recess portions 508 and bonded to the second side radiation member 504 through the bonding members 502. The convex portions 506 of the first side radiation member 503 are bonded to the principal electrodes of the surfaces 505a of the Si chips 501a, 501b.

Further, the control electrode of the Si chips 501a, 501b is electrically connected to the inner lead 510 of a lead frame 509 through a wire 511 by wire bonding. In FIG. 27, portions of the lead frame 509 overlapping with other portions are indicated with dotted lines. As described later, the lead frame 509 has six fixation portions 509a, 509b respectively having holes 512a, 512b for receiving the protruding portions 507a, 507b of the first side and second side radiation members 503, 504. Here, Al (aluminum), Au (gold), or the like can be used for the wire 511, and Cu, Cu alloy, 42-alloy, or the like can be used for the lead frame 509.

Then, as shown in FIG. 28B, the protruding portions 507b formed on the second side radiation member 504 are fit in the holes 512b formed in the fixation portions 509b of the lead frame 509, and are caulked. On the other hand, each of the protruding portions 507a formed on the first side radiation member 503 is fit in each of the holes 512a formed in the fixation portion 509a and caulked in a state where a spacer 513 is interposed between the first side radiation member 503 and the lead frame 509.

The spacer 513 is a columnar or prismatic metal such as Cu, and has a hole for allowing the protruding portion 507a to penetrate it. The spacer 513 positions the first side radiation member 503 with respect to the Si chips 501a, 501b in the thickness direction of the Si chips 501a, 501b. When the spacer 513 is a prism, for example, it has a square cross-section with a side of 2 mm, and a thickness of about 0.6 mm.

Further, as shown in FIGS. 27, 28A, and 28B, the Si chips 501a, 501b, and the radiation members 503, 504 fixed as described above are so sealed with resin 514 that each surface of the first side and second side radiation members 503, 504 at an opposite surfaces facing the Si chips 501a, 501b are exposed from the resin 514. In FIG. 27, the contour of the resin 514 is indicated with a broken line. Of the strip portions 503a, 503b, 504a, 504b of the first side and second side radiation members 503, 504, the strip portions 503a, 504b, which extend in the direction opposite to the side where the inner lead 510 is connected, protrude to the outside of the resin 514, and the externally protruding strip portions 503a, 504b respectively serve as outer electrodes of the Si chips 501a, 501b.

Next, a method for manufacturing the semiconductor substrate is explained. First, the lead frame 509, and the first side and second side radiation members 503, 504, as shown in FIGS. 27, 28A, 28B are prepared. The lead frame 509 is formed into a desirable shape by, for example, punching.

Figure 30A:
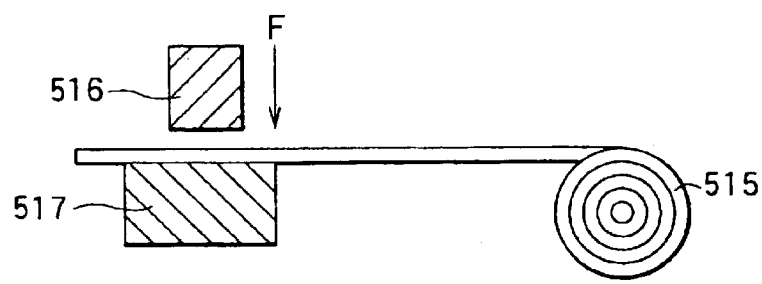
FIGS. 30A to 30D are schematic views showing a method for manufacturing radiation members in the seventeenth embodiment.
Figure 30B:
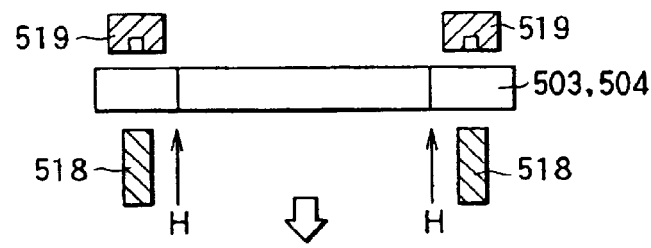
Figure 30C:
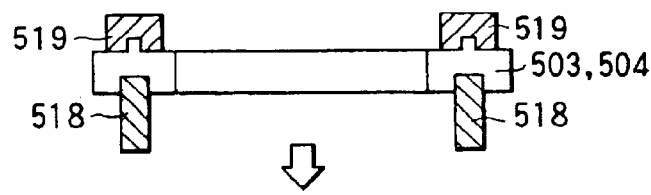
Figure 30D:

FIGS. 30A to 30D schematically show a method for forming the first side and second side radiation members 503, 504. As shown in FIG. 30A, the first side and second side radiation members 503, 504 are cut out of a reel-shaped member 515 made of Cu or the like, the convex portions 506 are formed on the first side radiation member 503, and the concave portions 508 are formed on the second side radiation member 504, by press working using a punch 516 and a die 517 while moving the punch 516 in a direction indicated by an arrow F. FIGS. 30B to 30D show a process for forming the protruding portions 507a, 507b. As shown in the figures, extruding working is performed to form the protruding portions 507a, 507b by using a punch 518 and a die 519 that has a recess at a center thereof, and by moving the punch 518 in a direction indicated by arrows H.

Next, the Si chips 501a, 501b are assembled with the lead frame 509 and the first side and second side radiation members 503, 504 processed as described above. FIG. 31 schematically shows constitutions of the respective members 501a, 501b, 502 to 504, and 509 viewed in a side face direction at this assembling step. As shown in FIG. 31, the protruding portions 507b of the second side radiation member 504 are inserted into the holes 512b of the fixation portions 509b of the lead frame 509, and are caulked. In the concave portions 508, the Si chips 501a, 501b are fitly disposed at the side of the surface 505b through solder foils 502 as bonding members.

Besides, solder foils 502 having shapes corresponding to those of the respective principal electrodes are disposed on the surfaces 505a of the Si chips 501a, 501b. The spacers 513 are respectively attached to the protruding portions 507a of the first side radiation member 503. Then, the protruding portions 507a are inserted into the holes 512a of the fixation portions 509a of the lead frame 509, and then caulked. Incidentally, the convex portions 506 of the first side radiation member 503 are omitted in FIG. 7.

The caulking fixation at this assembling step is specifically explained below. FIGS. 32A to 32C schematically shows the step for caulking fixation. As shown in FIGS. 32A and 32B, after the protruding portions 507a; 507b of the first side and second side radiation members 503, 504 are fit in the holes 512a, 512b of the fixation portions 509a, 509b of the lead frame 509, the protruding portions 507a, 507b protruding from the holes 512a, 512b are crushed by moving a punch 520 in a direction indicated by arrows I. Accordingly, as shown in FIG. 32C, the first side and second side radiation members 503, 504 and the lead frame 509 are fixed to each other.

Successively, the Si chips 501a, 501b, the radiation members 503, 504 and the lead frame 509 caulked together undergo solder reflow in a hydrogen furnace or the like, so that the members 501a, 501b, 503, 504 are integrally fixed by soldering. After that, after wire bonding is performed between the control electrode on the surface 505a of the IGBT chip 501 and the lead frame 509, sealing by the resin 514 is performed by transfer mold. Accordingly, the insulation between the first side and second side radiation members 503, 504 are achieved, and the semiconductor device in the present embodiment is completed.

According to the present embodiment, because the first side and second side radiation members 503, 504 are respectively bonded to the both surfaces 505a, 505b of the Si chips 501a, 501b through the bonding member 502, the radiation property can be improved. Further, the bonding member 502 is made of adhesive material having high thermal conductivity such as solder or brazing filler metal. This further improves the radiation property.

Besides, the Si chips 501a, 501b can be fixed to the second side radiation member 504 by being installed in the recess portions 508 of the second side radiation member 504. Further, and the first side and second side radiation members 503, 504 can be fixed with the lead frame 509 by inserting the protruding portions 507a, 507b of the radiation members 503, 504 into the holes 512a, 512b of the fixation portions 509a, 509b of the lead frame 509 and caulking them. As a result, the relative positions of these members can be fixed in a direction parallel to the surfaces of the Si chips 501a, 501b.

Also, the protruding portions 507a of the first side radiation member 503 are fit in the holes 512a of the fixation portions 509a of the lead frame 509 with the spacers 513 interposed between the first side radiation member 503 and the lead frame 509. Because of this, the first side radiation member 503 can be fixed to the lead frame 509 while providing a mounting space for the Si chips 501a, 501b, and further can be positioned relatively in the thickness direction of the Si chips 501a, 501b. Accordingly, the relative positions of the respective members can be fixed in both the surface direction and the thickness direction of the Si chips 501*a*, 501*b*. The semiconductor device can be provided with decreased variations in mounting positions of the members.

Figure 33:
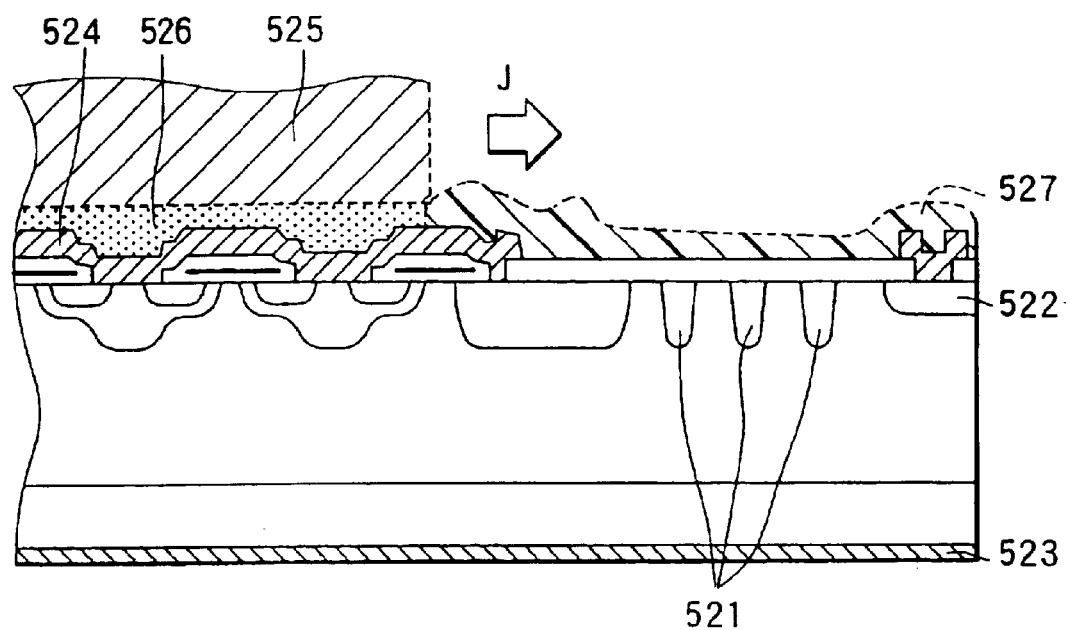
FIG. 33 is a cross-sectional view partially showing an IGBT chip as an example.

When a power element such as an IGBT is used as a semiconductor chip as in the present embodiment, there may arise the following problem regarding insulation. FIG. 33 shows an example of an IGBT.

As shown in FIG. 33, a power element such as an IGBT is formed with a guard ring 521 and an EQR (equipotential ring) 522 at an edge portion thereof, and the guard ring 521 and the EQR 522 are formed to have approximately the same potential as that of a collector electrode 523. The guard ring 521 and the EQR 522 are further formed on the surface of the power element where an emitter electrode 524 is formed. That is, the guard ring 521 and the EQR 522 equipotential with the collector electrode 523 exist in the vicinity of the emitter electrode 524.

Therefore, in a case of the power element in which a potential difference between the emitter electrode 524 and the collector electrode 523 is, for example, about 600 V, the potential difference between the guard ring 521, the EQR 522, and the emitter electrode 524 becomes also about 600 V. Because of this, if a radiation member 525 is positioned erroneously and shifted from an accurate position to the side of the guard ring 521 and the EQR 522 as shown in an arrow J in FIG. 33, the guard ring 521 and the EQR 522 might electrically communicate with the emitter electrode 524 through a bonding member 526 such as solder and the radiation member 525 directly or by discharge. Even if the guard ring 521 and the EQR 522 are covered with a protective film 527 made of polyimide or the like, the thickness of the film is about 1 to 2 $\mu$m at most, and the withstand voltage to 600 V cannot be secured.

To the contrary, in the semiconductor device of the present embodiment, as described above, in the state where the relative positions of the Si chips 501*a*, 501*b*, the lead frame 509, and the first side and second side radiation members 503, 504 are fixed, the convex portions 506 of the first side radiation member 503 are bonded to the principal electrodes on the surfaces 505*a* of the Si chips 501*a*, 501*b*. Because of this, the first side radiation member 503 can be brought in contact with only the principal electrodes by controlling the shape of the convex portions 506. This can also solve the problem concerning the insulation, caused by the deviation of the relative position of the radiation member 503 from the Si chips 501*a*, 501*b*.

The present embodiment exemplifies the example in which the spacers 513 are fitly attached to the protruding portions 507*a* of the first side radiation member 503; however, the protruding portions 507*a*, 507*b* may be formed in a stepped shape on the respective radiation members 503, 504 by, for example, forming the die 519 used for extruding processing shown in FIGS. 32B and 32C to have a stepped portion in the recess portion thereof. Thus, the spacers may be integrated with the protruding portions.

Besides, the spacers 513 are not limited to be attached to the protruding portions 507*a* of the first side radiation member 503, but may be attached to the protruding portion 507*b* of the second side radiation member 504 to fix the relative positions of the Si chips 501*a*, 501*b*, the radiation members 503, 504, and the lead frame 509 in the thickness direction of the Si chips 501*a*, 501*b*.

As in the present embodiment, when both the first side and second side radiation members 503, 504 are respectively fixed to the lead frame 509 by caulking, the variations in mounting positions of the semiconductor chips can be securely suppressed. However, only one of the radiation members 503, 504 may be fixed by caulking so long as the positioning accuracy of the radiation members 503, 504 is improved and the variations in mounting positions of the semiconductor chips are suppressed.

Each of the radiation members 503, 504 has a surface externally exposed at an opposite side of the Si chips 501*a*, 501*b*. The exposed surface may be brought in contact with a cooling member for accelerating the radiation of heat. The present embodiment exemplified the IGBT chip 501*a* as a semiconductor chip, and is so constructed that the variations in mounting position of the semiconductor chip is suppressed. Even when the radiation members 503, 504 are not used as electrodes, the constitution of the present invention is effective to improve the radiation property and to prevent the variations in mounting position of the semiconductor chip.

The spacers 513 are attached to all (three in the present embodiment) of the protruding portions 507*a* formed on the first side radiation member 503; however, the spacers provided at two locations are sufficient to fix the relative positions between the first side radiation member 503 and the Si chips 501*a*, 501*b* in the thickness direction of the Si chips 501*a*, 501*b*. The bonding members 502 are not limited to the solder foils, but may be solder paste or the like. The semiconductor device needs not always have the two semiconductor chips 501*a*, 501*b*, and have only to have one chip.

(Eighteenth Embodiment)

When the current capacity of the IGBT chip 501*a* exceeds 100 A, the chip size is increased, and there is a case the chip size becomes 10 to 0.16 mm. When the radiation members 503, 504 are made of Cu in such a case, since the linear expansion coefficient of Cu is 5 to 6 times larger than that of Si constituting the IGBT chip 501*a*, solder constituting the bonding member 502 is thermally fatigued in a thermal cycle. This may results in occurrence of cracks, increase in thermal resistance, and deterioration in the heat radiation property.

In this connection, an eighteenth preferred embodiment of the present invention has been made as follows. In this embodiment, the first side and second side radiation members 503, 504 are made of material different from that of the first embodiment. Hereinafter, different portions from those in the seventeenth embodiment are mainly described, and the same parts as those in the seventeenth embodiment are assigned to the same reference numerals.

Figure 34:
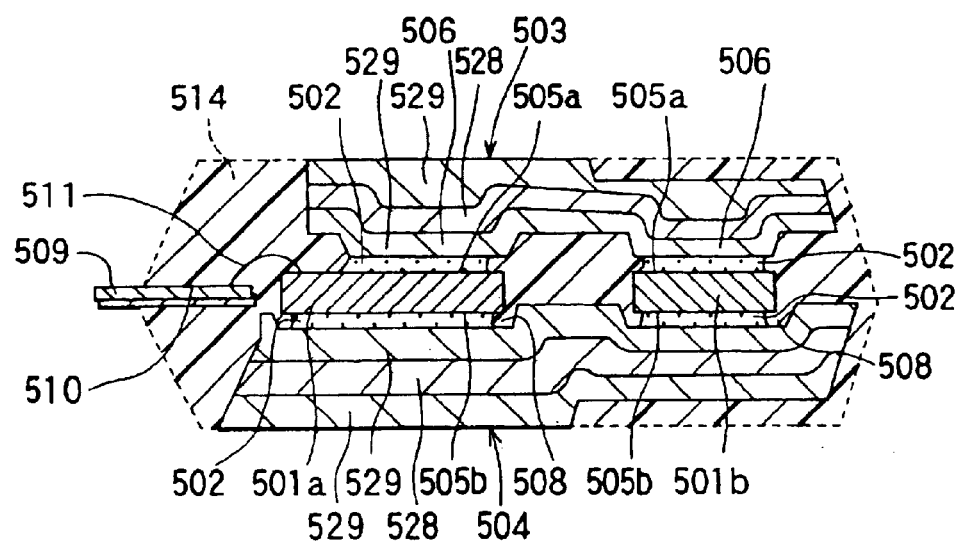
FIG. 34 is a cross-sectional view showing a semiconductor device in an eighteenth preferred embodiment.

As shown in FIG. 34, as the first side and second side radiation members 503, 504, metal having a leaner expansion coefficient similar to that of Si chips 501*a*, 501*b* is used. Specifically, as an example, clad members (CICs) each of which is so constructed that a member (invar member) 528 made of invar is sandwiched by members (Cu members) 529 made of Cu are adopted. The linear expansion coefficient of each CIC is approached to that of Si as close as possible by controlling the ratio in thickness between the invar member 528 and the Cu members 529, and the total thickness. The other members and features such as shapes are substantially the same as those in the seventeenth embodiment.

According to the eighteenth embodiment, because the linear expansion coefficient of the first side and second side radiation members 503, 504 is approximated to that of the Si chips 501*a*, 501*b*, even when each size of the chips 501*a*, 501*b* is large, thermal stress that is caused by the difference in thermal expansion coefficient between the Si chips 501*a*, 501*b* and the radiation members 503, 504 can be suppressed, and concentration of strain on the bonding members 502 can also be prevented. This prevents the deterioration in bonding property between the radiation members 503, 504 and the Si chips 501a, 501b. In consequence, the deterioration in radiation property and the decrease in electrical conductivity when the radiation members 503, 504 are used as electrodes can also be prevented.

The same effects as described above can be exhibited when Mo (molybdenum) is used in place of invar. In the radiation members 503, 504, the members 528 sandwiched by the Cu members 529 need not be unified to the invar or Mo member, and may be different from each other. The radiation members 503, 504 are not limited to the clad members, but may be other members such as Cu—Mo alloy having a linear expansion coefficient approximated to that of Si.

Incidentally, the eighteenth embodiment indicates an example using metal having a linear expansion coefficient approximated to that of Si, for the radiation members 503, 504, and adopts the clad members such as CIC as an example. However, thermal conductivities of invar and Mo are inferior to that of Cu, and the invar or Mo members 528 lower the radiation property in the thickness direction of the Si chips 501a, 501b. The following modified embodiment solves this problem.

Figure 35A:
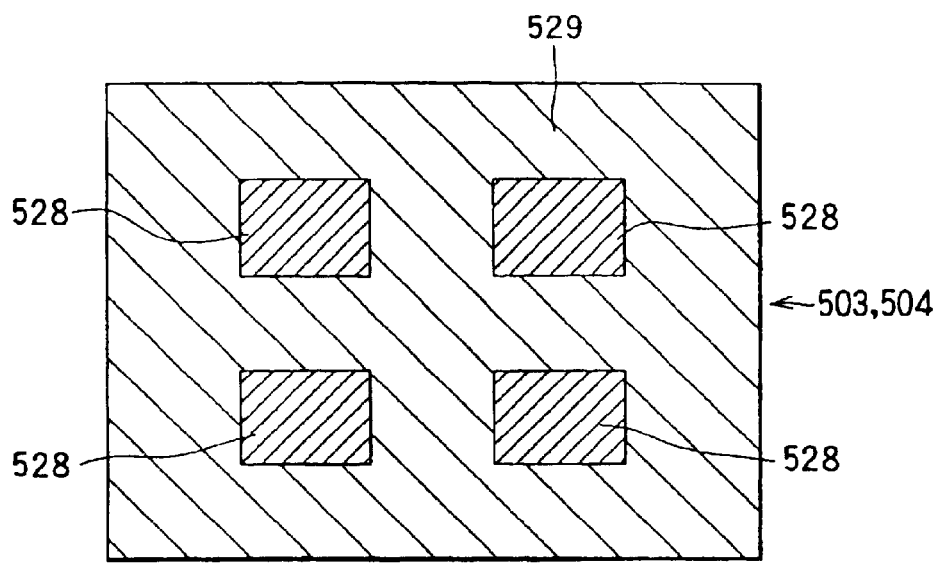
FIGS. 35A and 35B are cross-sectional views showing a radiation member used in a modified example of the eighteenth embodiment.
Figure 35B:
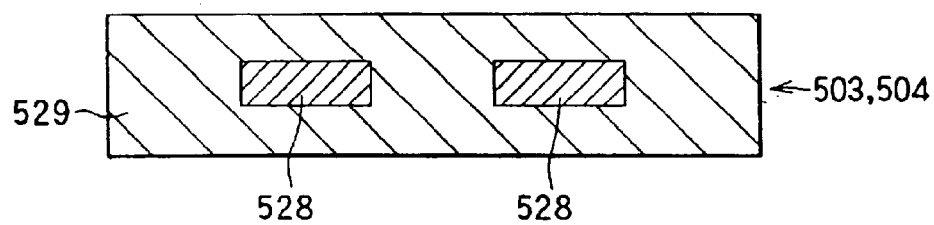

In this modified embodiment, as shown in FIGS. 35A and 35B, several invar members 528 are partially layered in the Cu member 529. FIG. 35A shows a cross-sectional view showing the radiation member 503, 504 cut in a direction parallel to the layer where it includes the invar members 528, while FIG. 35B shows a cross-sectional view showing the radiation member 503, 504, cut in a direction perpendicular to the layer where it includes the invar members 528.

As shown in FIGS. 35A and 35B, in this modified embodiment, the invar members 528 are provided at several (four) positions inside the Cu member 529. Accordingly, the radiation member 503, 504 has portions that are composed of only the Cu member 529 in the thickness direction thereof, so that the thermal conductivity in the thickness direction of the radiation member 503, 504 are not lessened. Thus, the radiation member approximated to Si in thermal expansion coefficient can be provided with sufficient radiation property. In this modified embodiment, although the invar members 528 are provided at four positions inside the Cu member 529, the invar members 528 may be formed into a fine mesh by, for example, providing many small sized invar parts. Mo members can be used in place of the invar members. Otherwise, the invar members and the Mo members are used simultaneously.

Figure 36:
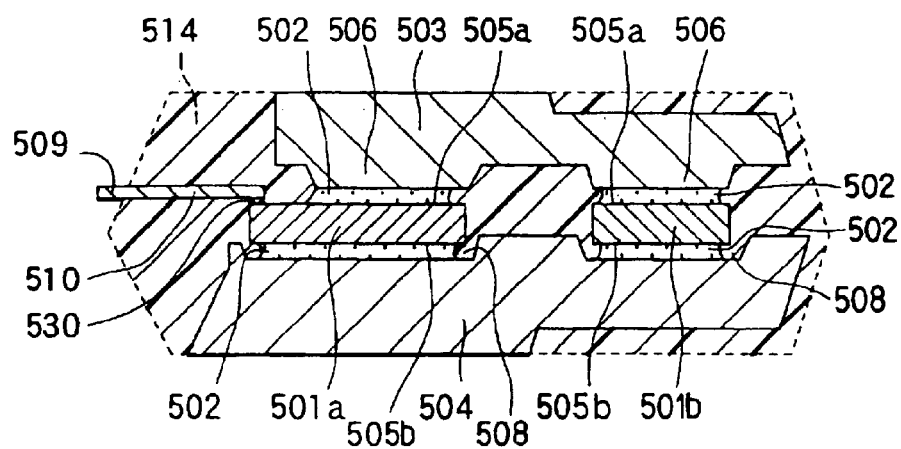
FIG. 36 is a cross-sectional view showing a semiconductor device in a modified embodiment of the seventeenth embodiment.

FIG. 36 shows a semiconductor device as another modified embodiment. In the seventeenth and eighteenth embodiment described above, the control electrode on the surface 505a of the IGBT chip 501a is electrically connected to the inner lead 510 by wire bonding; however, as shown in FIG. 36, the connection may be made by a bump-shaped bonding member 530 made of solder or the like. Accordingly, when soldering is performed between the first side and second side radiation members 503, 504 and the Si chips 501a, 501b, the connection between the inner lead 510 and the control electrode can be formed simultaneously. This results in simplification of the manufacturing process.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:

a semiconductor chip;

first and second radiation members thermally and electrically connected to the semiconductor chip interposed therebetween, and having a radiation surface for radiation heat from the semiconductor chip; and first and second bonding members respectively interposed between the first radiation member and the semiconductor chip and between the semiconductor chip and the second radiation member; and a pair of outside cooling members for radiating heat produced in the semiconductor chip respectively disposed over the first and second radiation members.

2. The semiconductor device of claim 1, wherein the first and second radiation members are made of metallic material that is superior to tungsten and molybdenum in at least one of an electrical conductivity and a thermal conductivity.

* * * * *